United States Patent
Yoshida et al.

(10) Patent No.: US 6,807,455 B2
(45) Date of Patent: Oct. 19, 2004

(54) SYSTEM FOR AND METHOD OF PROCESSING SUBSTRATE

(75) Inventors: Takushi Yoshida, Kyoto (JP); Tetsuya Hamada, Kyoto (JP)

(73) Assignee: Dainippon Screen Mfg. Co. Ltd. (JP)

(*) Notice: Subject to any disclaimer, the term of this patent is extended or adjusted under 35 U.S.C. 154(b) by 0 days.

(21) Appl. No.: 10/459,833

(22) Filed: Jun. 11, 2003

(65) Prior Publication Data

US 2004/0002784 A1 Jan. 1, 2004

(30) Foreign Application Priority Data

Jun. 26, 2002 (JP) .................................... P2002-186348
Jun. 26, 2002 (JP) .................................... P2002-186349

(51) Int. Cl.[7] ............................................. G06F 19/00
(52) U.S. Cl. .................. 700/121; 700/95; 700/108; 700/109; 700/110; 700/117; 438/14
(58) Field of Search ......................... 700/121, 108, 700/109, 110, 117, 95, 2, 4; 438/14

(56) References Cited

U.S. PATENT DOCUMENTS 6,487,472 B1 * 11/2002 Song et al. ................. 700/121

* cited by examiner

*Primary Examiner*—Leo Picard
*Assistant Examiner*—Charles Kasenge
(74) *Attorney, Agent, or Firm*—Osterlenk, Faber, Gerb & Soffen, LLP

(57) ABSTRACT

A reference command value is transmitted from an apparatus server (90) through a network (96*d*) to spin processing units (SR1–SR4) of a substrate processing apparatus (1). Next, a plurality of correction amounts for making processing states in the respective spin processing units (SR1–SR4) substantially the same are computed from a plurality of measured values corresponding to the respective spin processing units (SR1–SR4) and the reference command value, and are additionally stored in a correction amount database (90*a*). For execution of substrate processing, a plurality of correction amounts corresponding to the reference command value are extracted from the database, and corresponding ones of the correction amounts plus the reference command value are transmitted to the respective spin processing units (SR1–SR4).

20 Claims, 18 Drawing Sheets

F I G. 5

| PROCEDURE ID | APPARATUS NO. | PROCESSING PROCEDURE DATA ID | SEQUENCE NO. | ITEM ID | ITEM NAME | REFERENCE COMMAND VALUE |
|---|---|---|---|---|---|---|
| 10010 | 90 | 510 | 2 | 50 | SETTING OF FLOW CONTROL VALVE 28 | 15 |
| 10011 | 90 | 510 | 1 | 60 | SETTING OF THERMOCONTROLLER 27 | 25 |
| 10012 | 90 | 510 | 3 | 30 | RPM OF MOTOR 33 | 3000 |
| 10013 | 90 | 525 | 1 | 30 | RPM OF MOTOR 33 | 2500 |
| 10014 | 90 | 510 | 4 | 40 | OPENING OF VALVE 21 | 1 |
| ... | ... | ... | ... | ... | ... | ... |

F I G. 6

| PROCEDURE ID | APPARATUS NO. | PROCESSING PROCEDURE DATA ID | SEQUENCE NO. | ITEM ID | ITEM NAME | REFERENCE COMMAND VALUE |
|---|---|---|---|---|---|---|
| 10011 | 90 | 510 | 1 | 60 | SETTING OF THERMOCONTROLLER 27 | 25 |
| 10010 | 90 | 510 | 2 | 50 | SETTING OF FLOW CONTROL VALVE 28 | 15 |
| 10012 | 90 | 510 | 3 | 30 | RPM OF MOTOR 33 | 3000 |
| 10014 | 90 | 510 | 4 | 40 | OPENING OF VALVE 21 | 1 |
| ... | ... | ... | ... | ... | ... | ... |

FIG. 7

| CORRECTION AMOUNT ID | APPARATUS NO. | ITEM ID | ITEM NAME | REFERENCE COMMAND VALUE | CORRECTION AMOUNT | | | |
|---|---|---|---|---|---|---|---|---|
| | | | | | ΔSR1 | ΔSR2 | ΔSR3 | ΔSR4 |
| 20101 | 90 | 50 | SETTING OF FLOW CONTROL VALVE 28 | 15 | 2 | -1 | 0 | 3 |
| 20102 | 90 | 60 | SETTING OF THERMOCONTROLLER 27 | 25 | -0.5 | 0.25 | 0.1 | -0.1 |
| 20103 | 90 | 30 | RPM OF MOTOR 33 | 3000 | 30 | 50 | -50 | 12 |
| 20104 | 90 | 30 | RPM OF MOTOR 33 | 2500 | 25 | 42 | -43 | 9 |
| ... | ... | ... | ... | ... | ... | ... | ... | ... |

FIG. 15

| ITEM ID | APPARATUS NO. | ITEM NAME | REFERENCE COMMAND VALUE |
|---|---|---|---|
| 1 | 100 | DOWNFLOW STATE FORMED BY FILTER FAN UNIT | 30 |
| 2 | 100 | EXHAUST PRESSURE | 25 |
| 3 | 100 | PRESSURE OF NITROGEN GAS SUPPLIED FROM COMMON NITROGEN GAS SOURCE | 20 |
| 4 | 100 | PRESSURE OF PURE WATER SUPPLIED FROM COMMON PURE WATER SOURCE | 15 |
| ⋮ | ⋮ | ⋮ | ⋮ |

FIG. 16

| CORRECTION AMOUNT ID | APPARATUS NO. | ITEM ID | CORRECTION AMOUNT |
|---|---|---|---|
| 10101 | 200 | 1 | 2 |
| 10102 | 200 | 2 | -1 |
| 10103 | 200 | 3 | 0.5 |
| 10104 | 200 | 4 | -0.3 |
| ⋮ | ⋮ | ⋮ | ⋮ |

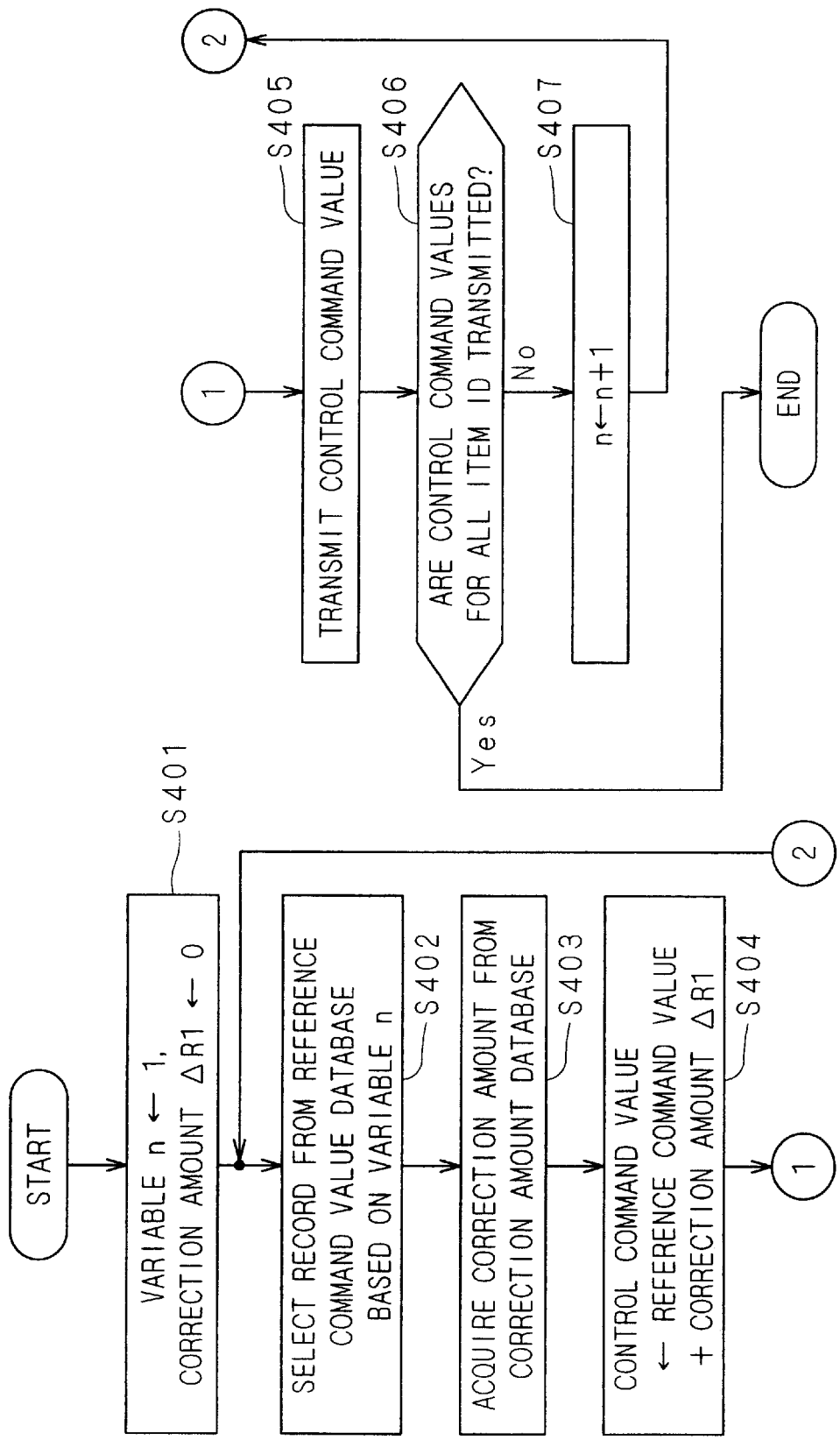

SYSTEM FOR AND METHOD OF PROCESSING SUBSTRATE

BACKGROUND OF THE INVENTION

1. Field of the Invention

The present invention relates to a substrate processing system and a substrate processing method for performing predetermined processing on substrates including a semiconductor substrate, a glass substrate for a liquid crystal display device, a glass substrate for a photomask, a substrate for an optical disc, and the like. More particularly, the invention relates to an improvement for making the processing states of respective substrates processed in parallel substantially the same, and an improvement for making the substrate processing environments of respective substrate processing apparatuses substantially the same.

2. Description of the Background Art

A substrate processing apparatus performs successive surface preparation processes including a chemical process, a cleaning process and the like using various liquid chemicals and pure water (collectively referred to as a "processing solution"). One of the processes known in the art is a polymer removal process after dry etching. For instance, the polymer removal process in a single-wafer type substrate processing apparatus for processing substrates one by one includes: (1) applying a liquid chemical to a substrate while spinning the substrate to modify a polymer residue which is part of a resist deposited on the bottom or side wall of a wiring pattern; and (2) applying pure water to the substrate while spinning the substrate to rinse off the modified polymer residue, thereby removing the polymer residue from the substrate. Since the single-wafer polymer removal process is performed on one substrate at a time, a plurality of processing units are conventionally used to perform the removal process in parallel in the light of improvements in throughput.

An approach to produce much more substrates is to purchase a new substrate processing apparatus to increase the number of substrate processing apparatuses. Purchase of a new substrate processing apparatus identical in hardware construction with an existing substrate processing apparatus having been in operation in a semiconductor factory allows the use of parameters (e.g., settings of a filter fan unit for forming a downflow in the substrate processing apparatus) of the existing apparatus as parameters required to set a substrate processing environment.

Even though the plurality of processing units are basically the same in construction, the specific constructions and functions of the units are not necessarily the same since the installation environments of the units are not completely the same. This might results in variations between processing results of the respective substrates. For example, when attention is focused on pipes for supplying a liquid chemical from a liquid chemical source to a plurality of processing units, the lengths of the pipes from the liquid chemical source to the plurality of processing units are not necessarily equal to each other. This might cause different values of liquid chemical discharge timing, liquid chemical discharge pressure, liquid chemical discharge amount, and the like if the same reference command value for discharge of the liquid chemical is sent to the plurality of processing units. This causes different processing conditions of the substrates in the respective processing units to result in variations between the processing results of the substrates even in the same lot.

The above-mentioned processing result variations also occur between substrate processing apparatuses. Specifically, even though the existing apparatus and the new apparatus are basically the same in construction, the specific constructions and functions of the substrate processing apparatuses are not necessarily the same since the installation environments of the substrate processing apparatuses are not completely the same. This might results in variations between processing results of the respective substrates. For example, when attention is focused on pipes for supplying a liquid chemical from a common liquid chemical source installed in the semiconductor factory to the existing apparatus and the new apparatus, the lengths of the pipes from the liquid chemical source to the plurality of substrate processing apparatuses are not necessarily equal to each other. This might cause different pressure values in the pipes of the liquid chemical from the liquid chemical source between the existing apparatus and the new apparatus. This causes different processing conditions of the substrates in the respective substrate processing apparatuses to result in the processing result variations.

The conventional solutions to the above-mentioned problems are as follows: To solve the problem of the processing result variations between the processing units, an operator of the substrate processing apparatus previously calculates correction amounts for the respective processing units by experiment or the like. Then, a control command value including a reference command value plus the correction amount is sent to each of the processing units to reduce the difference in processing state between the processing units, thereby suppressing the substrate processing result variations between the processing units.

To solve the problem of the processing result variations between the existing apparatus and the new apparatus, the operator previously calculates a correction amount which makes the substrate processing environments of the existing and new apparatuses substantially the same, based on parameters of the existing apparatus by experiment or the like, to make the substrate processing environments of the existing and new apparatuses substantially the same, thereby suppressing the substrate processing result variations.

However, because of the recent trends toward finer wiring patterns and more layers of wiring, substrate processing has been required to control the processing conditions more accurately than ever. In some types of the substrate processing, a change in substrate processing conditions such as a changeover might cause the difference in processing conditions between the processing units to be out of tolerance when the previously calculated correction amounts are used. Thus, the operator must calculate the correction amounts so as to reduce the difference between the processing units each time the substrate processing conditions are changed. This increases the time and labor for the operator to operate, resulting in the increase in manufacturing costs of semiconductor devices.

There is a need to accurately control not only the processing conditions of the processing units but also the processing conditions of the substrate processing apparatuses. Thus, the operator must calculate the correction amount which makes the substrate processing environments substantially the same more accurately. This increases the time and labor for the operator to operate, resulting in the increase in manufacturing costs of substrates.

The above-mentioned problems resulting from the difference in substrate processing conditions between the processing units and the difference in substrate processing environment between the substrate processing apparatuses are encountered not only in the polymer removal process but also in general substrate processing.

SUMMARY OF THE INVENTION

The present invention is intended for a substrate processing system.

According to the present invention, the substrate processing system comprises: a) a substrate processing apparatus having a plurality of processing units capable of processing substrates in parallel; and b) an information processor connected through a network to the substrate processing apparatus, the information processor including: b-1) a first sending part for transmitting a first reference value as a control command value for a substrate processing function to the plurality of processing units; b-2) a receiving part for receiving a plurality of measured values from the substrate processing apparatus, the plurality of measured values indicating respective substrate processing states in the plurality of processing units detected when the plurality of processing units are controlled in accordance with the first reference value transmitted as the control command value; b-3) a computing part for computing a plurality of correction amounts from the first reference value and the plurality of measured values, the plurality of correction amounts making the substrate processing states in the plurality of processing units substantially the same; and b-4) a first database for storing the plurality of correction amounts in association with the first reference value, the substrate processing apparatus including: a-1) a control part for controlling substrate processing in the plurality of processing units, based on the control command value transmitted from the information processor; a-2) a measuring part for obtaining the plurality of measured values; and a-3) a second sending part for transmitting the plurality of measured values to the information processor.

The substrate processing system can make the processing states in the respective processing units substantially the same while shortening the time for startup of the substrate processing apparatus and the time for changeover in substrate processing. Additionally, the system can improve the efficiency of management of the substrate processing.

Preferably, the computing part carries out new computation of the plurality of correction amounts unless the same reference value as the first reference value is stored in the first database.

This prevents the additional storage of the same correction amount in the first database while shortening the time to determine the plurality of correction amounts.

Preferably, the substrate processing apparatus further includes a-4) a second database for storing processing procedure data, and a-5) a selective sending part for selecting processing procedure data from the second database in response to a request from the information processor to transmit the selected processing procedure data to the information processor. The information processor further includes b-5) an extraction part for searching the first database for the first reference value equal to a second reference value included in the selected processing procedure data transmitted from the selective sending part to extract the plurality of correction amounts corresponding to the first reference value searched for. The first sending part transmits the second reference value corrected using the plurality of correction amounts as the control command value to the plurality of processing units, respectively.

This allows separate storage and management of the processing procedure data and the plurality of correction amounts to accomplish the control of the plurality of processing units by using the single processing procedure data.

The present invention is also intended for a method of processing substrates placed respectively in a plurality of processing units in parallel.

According to the present invention, the method comprises the steps of: a) transmitting a reference command value to the plurality of processing units to perform substrate processing; b) obtaining a plurality of measured values indicating respective processing states in the plurality of processing units detected in the step a); and c) computing a plurality of correction amounts from the reference command value and the measured values, the plurality of correction amounts making the processing states in the plurality of processing units substantially the same.

The method can make the processing states in the respective processing units substantially the same.

The present invention is also intended for a substrate processing system.

According to the present invention, the substrate processing system comprises: a) a substrate processing apparatus having a plurality of processing units capable of processing substrates in parallel; and b) an information processor connected through a network to the substrate processing apparatus, the information processor including: b-1) a first sending part for transmitting a first reference value as a control command value for a substrate processing function to the plurality of processing units; b-2) a receiving part for receiving a plurality of measured values from the substrate processing apparatus, the plurality of measured values indicating respective substrate processing states in the plurality of processing units detected when the plurality of processing units are controlled in accordance with the first reference value transmitted as the control command value; b-3) a computing part for computing a plurality of correction amounts from a specific measured value indicating a processing state in one of the plurality of processing units and the remainder of the measured values other than the specific measured value, the plurality of correction amounts making the substrate processing state in other than the one processing unit substantially the same as that in the one processing unit; and b-4) a first database for storing the plurality of correction amounts in association with the first reference value, the substrate processing apparatus including: a-1) a control part for controlling substrate processing in the plurality of processing units, based on the control command value transmitted from the information processor; a-2) a measuring part for obtaining the plurality of measured values; and a-3) a second sending part for transmitting the plurality of measured values to the information processor.

The substrate processing system can make the processing states in the respective processing units substantially the same while shortening the time for startup of the substrate processing apparatus and the time for changeover in substrate processing.

The present invention is also intended for a substrate processing system.

According to the present invention, the substrate processing system comprises: a) a first substrate processing apparatus; b) a second substrate processing apparatus connected through a network to the first substrate processing apparatus; and c) an information processor connected through the network to the first and second substrate processing apparatuses, the information processor including: c-1) a first database for storing a reference value as a control command value for controlling a substrate processing environment of the first substrate processing apparatus; c-2) a first sending part for transmitting the reference value stored in the first database as the control command value for controlling a substrate processing environment of the second substrate processing apparatus; c-3) a receiving part for receiving a measured value from the second substrate processing apparatus, the measured value indicating the substrate processing environment of the second substrate processing apparatus detected when the second substrate processing apparatus is controlled in accordance with the reference value transmitted from the first sending part; c-4) a computing part for computing a correction amount from the reference value transmitted from the first sending part and the measured value, the correction amount making the substrate processing environments of the first and second processing apparatuses substantially the same; and c-5) a second database for storing the correction amount in association with the reference value transmitted from the first sending part, the second substrate processing apparatus including: b-1) a control part for controlling an element in the second substrate processing apparatus, based on the control command value transmitted from the information processor; b-2) a measuring part for obtaining the measured value; and b-3) a second sending part for transmitting the measured value to the information processor.

The substrate processing system can make the substrate processing environments of the first and second substrate processing apparatuses substantially the same while shortening the time for startup of the second substrate processing apparatus.

Preferably, the information processor further includes c-6) an extraction part for extracting a corresponding correction amount from the second database, the corresponding correction amount being the correction amount corresponding to a select reference value selected as the reference value from the first database. The first sending part transmits the select reference value corrected using the corresponding correction amount as the control command value to the second substrate processing apparatus.

This allows the control of the substrate processing environments of the first and second substrate processing apparatuses by the use of the single reference value.

The present invention is also intended for a method of processing a substrate.

According to the present invention, the method comprises the steps of: a) transmitting a reference value transmitted as a control command value to a first substrate processing apparatus also to a second substrate processing apparatus to set a substrate processing environment of the second substrate processing apparatus; b) acquiring a measured value indicating the substrate processing environment of the second substrate processing apparatus detected when the second substrate processing apparatus is controlled using the reference value; and c) computing a correction amount for the reference value from the reference value and the measured value, the correction amount making the substrate processing environments of the first and second substrate processing apparatuses substantially the same.

The method can make the substrate processing environments of the first and second substrate processing apparatuses substantially the same while shortening the time for startup of the second substrate processing apparatus.

It is therefore a primary object of the present invention to provide a substrate processing system including a substrate processing apparatus having a plurality of processing units for performing substrate processing in parallel and capable of making processing states in the respective processing units substantially the same by the use of a single reference command value, and a method therefor.

It is another object of the present invention to provide a technique for making substrate processing environments of respective substrate processing apparatuses substantially the same in a substrate processing system including the substrate processing apparatuses for performing the same substrate processing.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 5 and 6 show an example of the construction of a processing procedure database stored in the substrate processing apparatus according to the first preferred embodiment;

FIG. 7 shows an example of the construction of a correction amount database stored in the apparatus server according to the first preferred embodiment;

FIG. 15 shows an example of the construction of a reference command value database stored in the apparatus server according to the second preferred embodiment;

FIG. 16 shows an example of the construction of a correction amount database stored in the substrate processing apparatus according to the second preferred embodiment;

FIG. 19 is a flowchart showing an example of a substrate processing environment setting procedure using the correction amount according to the second preferred embodiment.

DESCRIPTION OF THE PREFERRED EMBODIMENTS

Preferred embodiments according to the present invention will now be described with reference to the drawings.

<1. First Preferred Embodiment>

<1.1. General Construction of Substrate Processing System>

Figure 1:
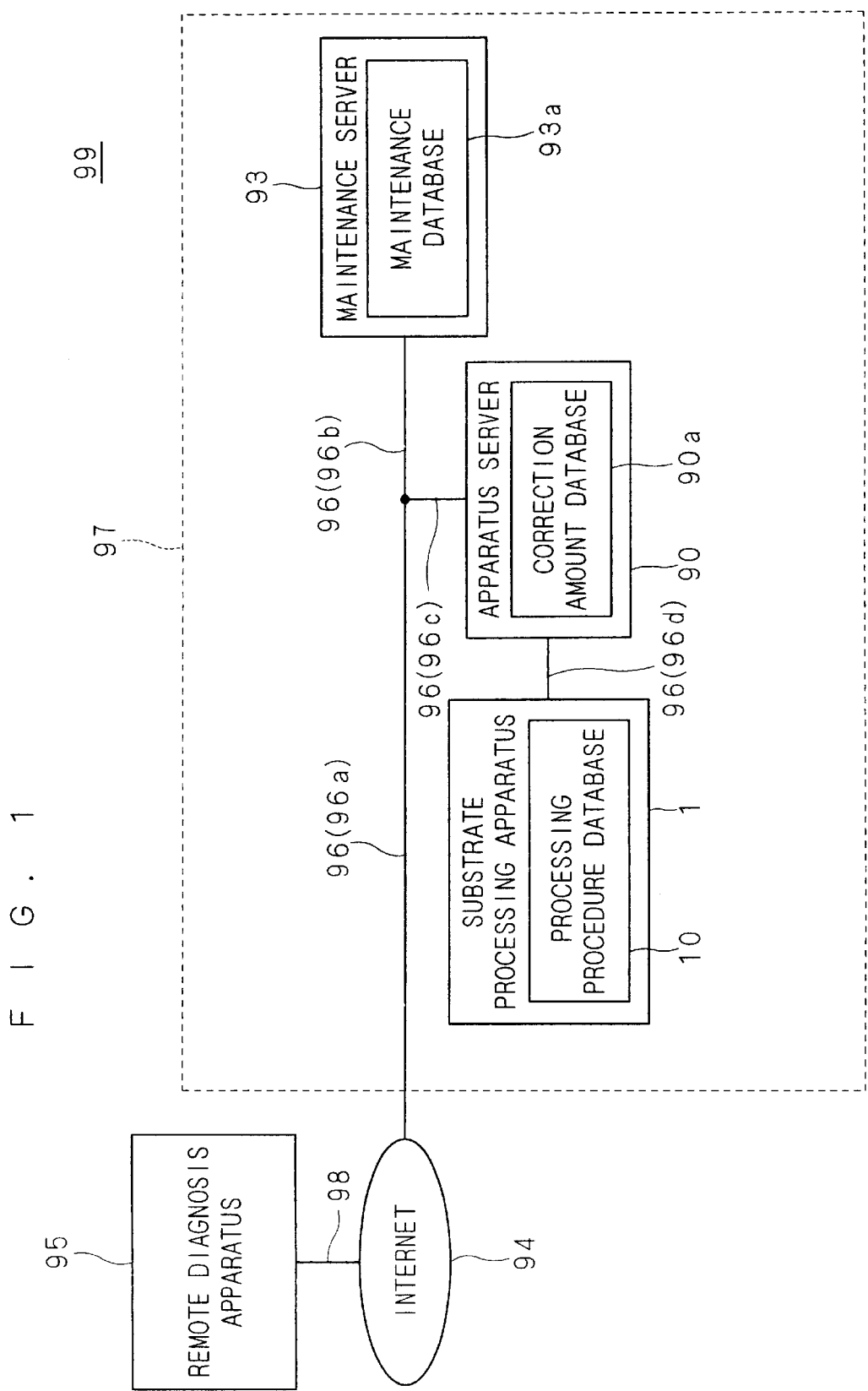
FIG. 1 is a diagram of a substrate processing system according to a first preferred embodiment of the present invention.

FIG. 1 is a block diagram showing the construction of a substrate processing system 99 according to a first preferred embodiment of the present invention. As shown in FIG. 1, the substrate processing system 99 principally comprises: a substrate processing apparatus 1 for performing a polymer removal process on a plurality of processing units in parallel; a maintenance server 93 for storing and analyzing the processing state of each substrate processed in the substrate processing apparatus 1 and the use of the substrate processing apparatus 1; an apparatus server 90 for carrying out computation and the like of correction amounts for making the processing states in the respective processing units of the substrate processing apparatus 1 substantially the same; and a network 96 for establishing connection between the substrate processing apparatus 1, the apparatus server 90 and the maintenance server 93. These components 1, 93, 90 and 96 of the substrate processing system 99 are installed in the same semiconductor manufacturing factory (referred to simply as a factory hereinafter) 97.

The hardware construction of the maintenance server 93 is similar to that of a typical computer. Based on a processing procedure stored in a processing procedure database 10, the maintenance server 93 stores in a maintenance database 93a data (referred to hereinafter as "processing state data") indicating the processing states of substrates processed in respective spin processing units SR1 to SR4 (also generically referred to as spin processing units SR) (see FIG. 2) of the substrate processing apparatus 1, and analyzes the processing states and processing results of the substrates based on the data. The processing state data (e.g., RPM history detected by an encoder 33a of a motor 33 of the spin processing unit SR1 to be described later, and discharge pressure history of a liquid chemical discharged from a removal solution discharge nozzle 24) about the substrates processed in the substrate processing apparatus 1 is transmitted through the network 96 to the apparatus server 90, is subjected to processing in the apparatus server 90, and is stored in the maintenance database 93a of the maintenance server 93.

The processing state data stored in the maintenance database 93a has a substrate identifier appended thereto for uniquely identifying each substrate processed in the substrate processing apparatus 1. By the use of substrate processing state analysis software incorporated in the maintenance server 93, an operator can extract the processing state data about a particular substrate identified by the substrate identifier from the maintenance database 93a to check up on the current processing state of the particular substrate, and, if a processing failure occurs in a substrate, can analyze in which step the cause of the processing failure arises, based on the processing state data extracted from the maintenance database 93a.

The substrate processing apparatus 1 and the apparatus server 90 are accessible by the maintenance server 93 through the network. Thus, the operator in a location where the maintenance server 93 is installed can access the processing procedure database 10 of the substrate processing apparatus 1 and a correction amount database 90a of the apparatus server 90 to reference or correct the data stored in these databases.

A remote diagnosis apparatus 95 is installed in a location other than the factory 97, and is connected to the substrate processing apparatus 1, the apparatus server 90 and the maintenance server 93 in the factory 97 through a local network 98, the Internet 94 which is a wide area network and the intra-factory network 96. Substrate processing state analysis software similar to that in the maintenance server 93 is incorporated in the remote diagnosis apparatus 95. Thus, an operator at the location of the remote diagnosis apparatus 95 can check up on the processing state of a substrate processed in the substrate processing apparatus 1 in the factory 97 and analyze the processing result thereof.

<1.2. Constructions of Substrate Processing Apparatus and Apparatus Server>

Figure 2:
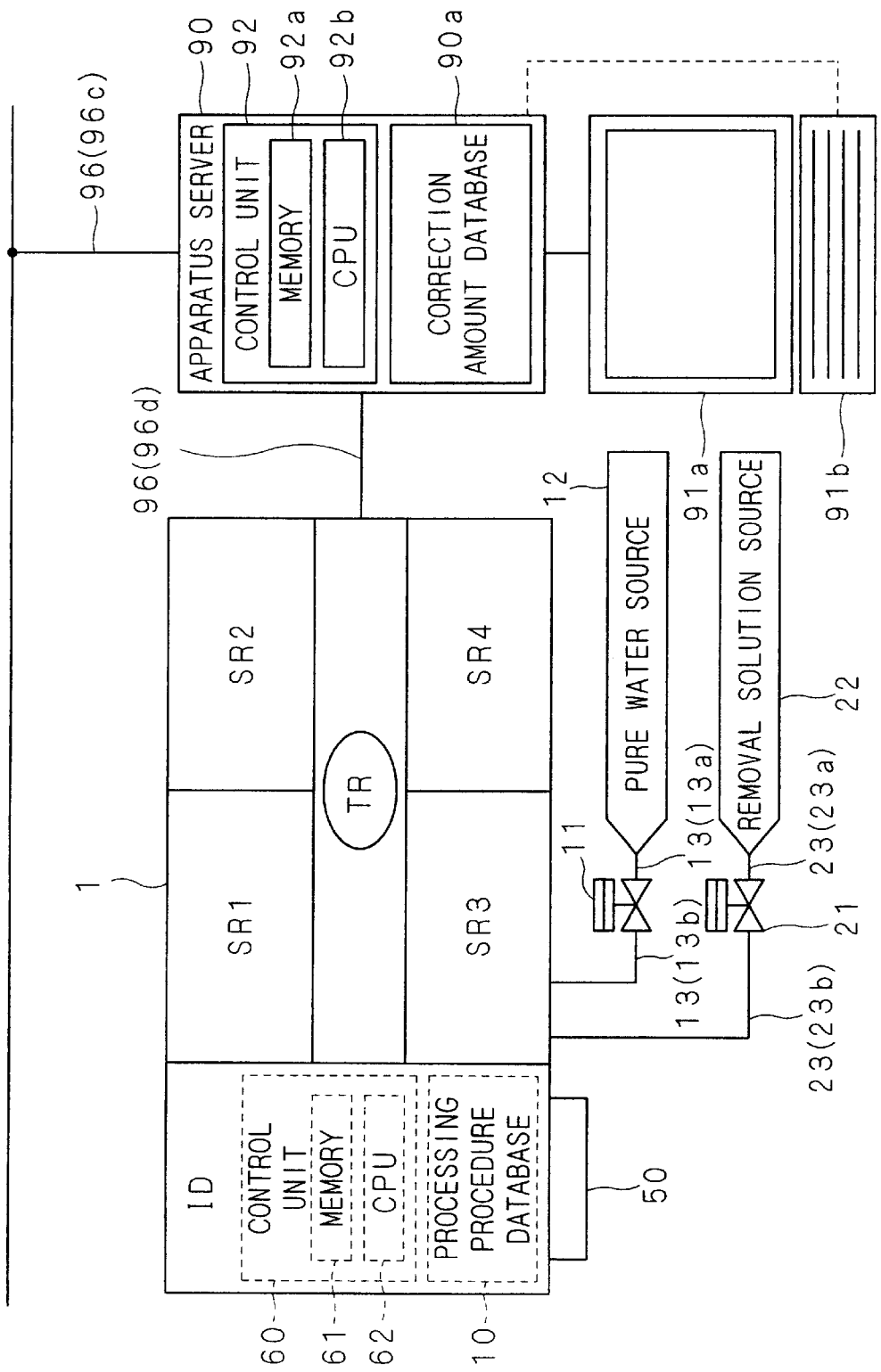
FIG. 2 shows the constructions of a substrate processing apparatus and an apparatus server according to the first preferred embodiment.

FIG. 2 shows the constructions of the substrate processing apparatus 1 and the apparatus server 90. Description will be given first on the construction of the substrate processing apparatus 1 for performing the polymer removal process and the spin processing units SR1 to SR4 which are components of the substrate processing apparatus 1, and then on the apparatus server 90 for computing and storing the correction amounts and the like for making the processing states in the respective spin processing units SR1 to SR4 substantially the same.

<1.2.1. Construction of Substrate Processing Apparatus>

The substrate processing apparatus 1 is intended to perform the polymer removal process for removing a polymer residue which is part of a resist film spattered, deposited on the bottom and side walls of a wiring pattern, and hardened in the process of dry etching using the resist film as a mask. As shown in FIG. 2, the substrate processing apparatus 1 principally comprises the plurality of spin processing units SR1 to SR4, an indexer ID, and a transport robot TR.

The indexer ID places thereon a cassette or carrier (not shown) which can accommodate a plurality of substrates, and includes a mobile robot. The indexer ID transfers an unprocessed substrate from the cassette to the transport robot TR and receives a processed substrate from the transport robot TR to store the processed substrate in the cassette.

Figure 3:
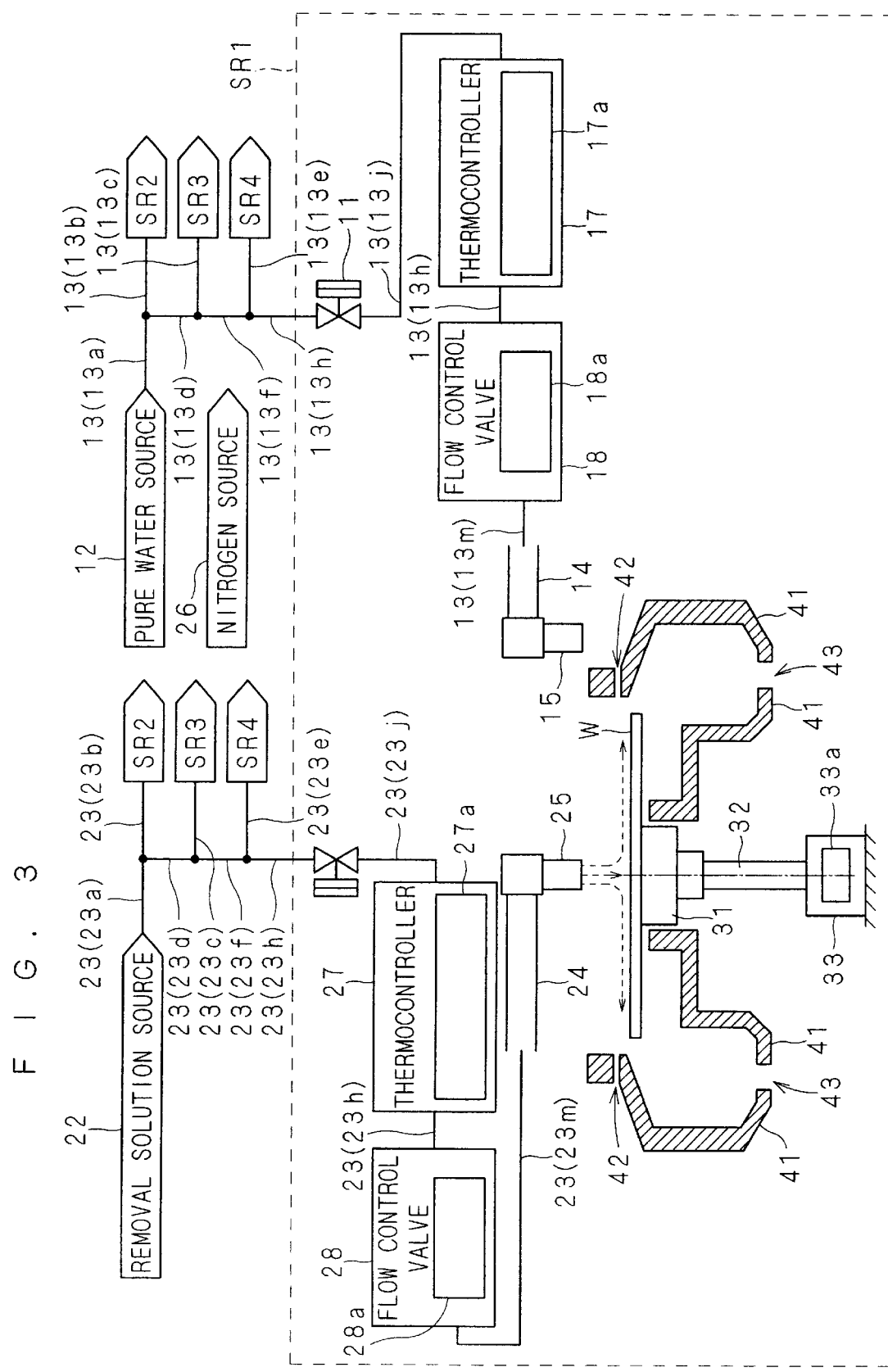
FIGS. 3 and 4 show a spin processing unit according to the first preferred embodiment.

FIG. 3 shows the constructions of the spin processing unit SR1 in the substrate processing apparatus 1 and a processing solution supply part for supplying a removal solution and the like for use in the removal of the polymer residue. Although only the spin processing unit SR1, which is similar in internal construction to the spin processing units SR2 to SR4, will be described herein, pipes for supplying a processing solution and the like to the respective spin processing units SR1 to SR4 have different lengths, resulting in a functional numeric difference (to be described later).

The spin processing unit SR1 is a unit for applying the processing solution to a substrate while spinning or rotating the substrate to remove the polymer residue from the substrate. A holding part 31 holds a substrate W in a substantially horizontal position thereon under suction. The lower surface of the holding part 31 is fixed to the upper end of a rotary shaft 32 of the motor 33 for rotating the substrate W about a vertical axis.

A vertically movable cup 41 of circular cross-sectional configuration is provided around the holding part 31 in such a manner as to surround the substrate W to prevent the processing solution applied to the substrate W from spattering outwardly of the spin processing unit SR1. Drain ports 43 are provided in the bottom of the cup 41. An excess amount of the processing solution applied to the substrate W flows on the inner wall of the cup 41 and is drained from the drain ports 43 through a drain pipe (not shown) to a drain not shown. The cup 41 is provided with vents 42 substantially on a level with the horizontal surface of the substrate W and opened toward the substrate W. The vents 42 are connected to an exhaust pump (not shown) and an exhaust pipe not shown. The exhaust pump emits gas near the substrate W through the exhaust pump and the exhaust pipe to an exhaust drain not shown.

The removal solution discharge nozzle 24 has a double-pipe structure. The term "double-pipe structure" used herein refers to a coaxial structure including an inner pipe of circular cross-sectional configuration having a predetermined outside diameter and an outer pipe of circular cross-sectional configuration having an inside diameter greater than the outside diameter of the inner pipe, the inner and outer pipes having a common central axis.

The inner pipe is connected in communication with a removal solution source 22 through a pipe 23, an electromagnetic valve 21, a thermocontroller 27 for adjusting the temperature of the removal solution flowing through the pipe 23, and a flow control valve 28 for adjusting the flow rate of the removal solution flowing through the pipe 23. The removal solution is applied through a discharge port 25 onto the substrate W by opening the valve 21 while the holding part 31 is rotated. The outer pipe is connected in communication with a nitrogen source 26 through a pipe not shown. Nitrogen gas supplied through the removal solution discharge nozzle 24 is applied through the discharge port 25 onto the substrate W. The removal solution supplied from the removal solution source 22 used herein refers to a polymer removal solution for selectively removing only the polymer residue deposited on the bottom and side walls of a wiring pattern formed on a substrate, and includes a liquid containing an organic alkaline solution, a liquid containing an organic acid, and a liquid containing an antimony fluoride based material.

The thermocontroller 27 is a device for adjusting the temperature of the removal solution flowing through the pipe 23, and includes a detector having a sensor 27a for detecting the temperature of the removal solution flowing through the pipe 23, and a controller for controlling the temperature of the removal solution flowing through the pipe 23, based on a command value transmitted from a control unit 60. Thus, the removal solution flowing through the pipe 23 is adjusted to a predetermined temperature, based on the temperature measured by the detector of the thermocontroller 27.

The flow control valve 28 includes a detector having a sensor 28a for detecting the flow rate per unit time of the removal solution flowing through the pipe 23, and a controller for adjusting the flow rate of the removal solution flowing through the pipe 23, based on a command value transmitted from the control unit 60. Thus, the removal solution flowing through the pipe 23 is adjusted to a predetermined flow rate, based on the flow rate measured by the detector of the flow control valve 28.

Figure 4:
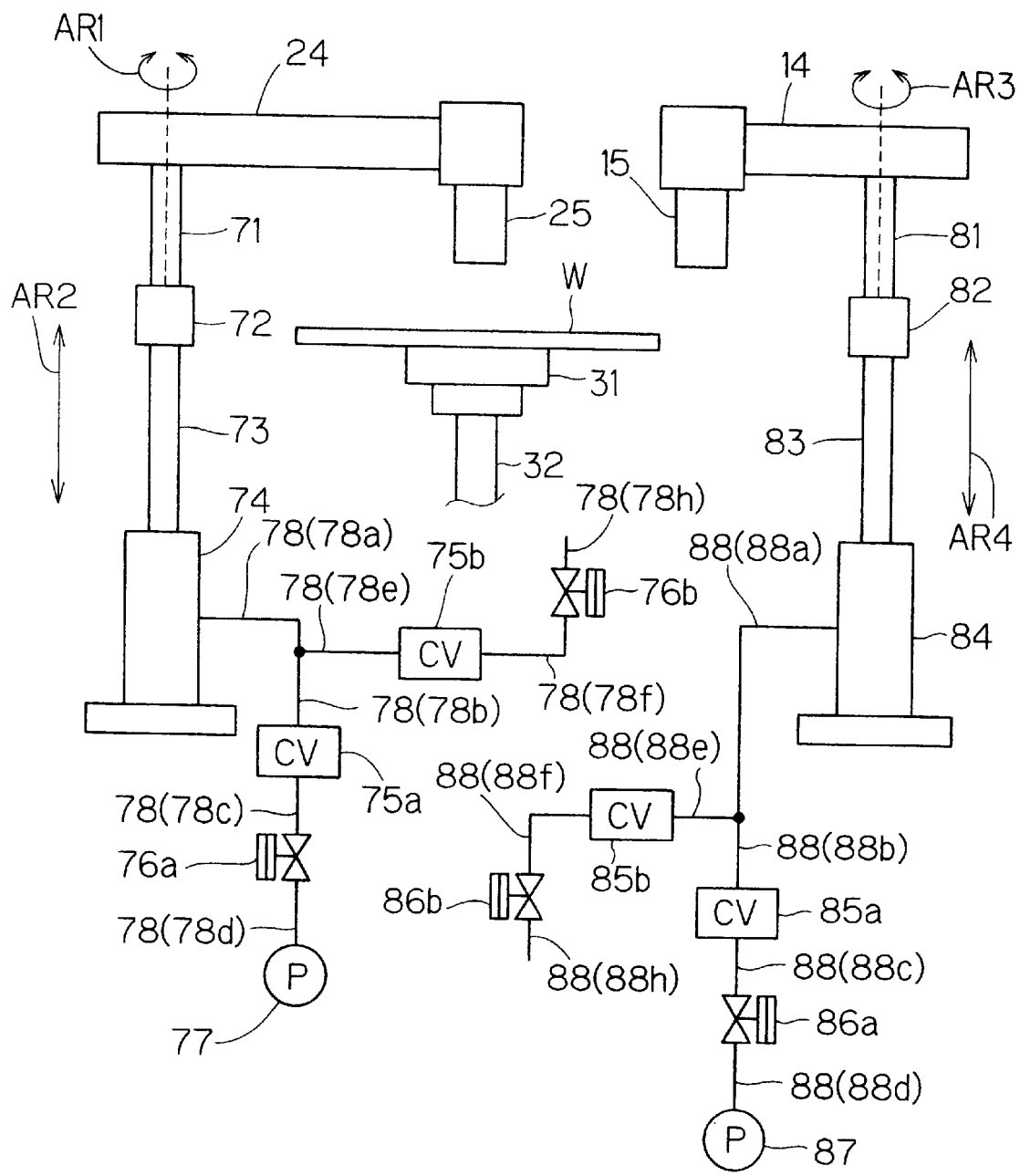

The removal solution discharge nozzle 24 is pivotable from a retracted position not shown to a discharge position in which the removal solution is applied to the substrate W. FIG. 4 shows a configuration of the spin processing unit SR1 near the removal solution discharge nozzle 24. As shown in FIG. 4, the removal solution discharge nozzle 24 is connected to a motor 72 through a rotary shaft 71 on the opposite side from the discharge port 25. Thus, the removal solution discharge nozzle 24 is pivotable in the directions indicated by the double-headed arrow AR1.

A lower part of the motor 72 is connected through a movable part 73 to a cylinder 74. The cylinder 74 is adapted to move the movable part 73 vertically as indicated by the double-headed arrow AR2 in accordance with the air pressure inside the cylinder 74. The air pressure is determined by the amount of air supplied to the cylinder 74 through a pump 77, a pipe 78, a valve 76a and a control valve 75a, and the amount of air emitted outwardly of the cylinder 74 through the pipe 78, a control valve 75b and a valve 76b.

For example, as the pump 77 is actuated, with the valve 76b closed and the valve 76a open, to supply air in the atmosphere through the valve 76a, the control valve 75a and the pipe 78 to the cylinder 74, the air pressure in the cylinder 74 increases to move the movable part 73 upwardly, thereby moving the removal solution discharge nozzle 24 upwardly. On the other hand, as the pump 77 is stopped, with the valve 76a closed and the valve 76b open, to emit the air in the cylinder 74 through the control valve 75b, the valve 76b and the pipe 78 to the outside, the air pressure in the cylinder 74 decreases to move the movable part 73 downwardly, thereby moving the removal solution discharge nozzle 24 downwardly. The control valves 75a and 75b are speed control valves for controlling the speed of air flowing through the pipe 78, and each includes a detector for detecting the speed of the air flowing through the pipe 78, and a controller for controlling the speed of the air flowing through the pipe 78, based on a command value transmitted from the control unit 60. Thus, the air flowing through the pipe 78 is adjusted to a predetermined speed, based on the speed of air measured by the detectors of the respective control valves 75a and 75b.

A pure water discharge nozzle 14 has a double-pipe structure similar to that of the removal solution discharge nozzle 24. The inner pipe of the pure water discharge nozzle 14 is connected in communication with a pure water source 12 through a pipe 13, a valve 11, a thermocontroller 17 for adjusting the temperature of pure water flowing through the pipe 13, and a flow control valve 18 for adjusting the flow rate of the pure water flowing through the pipe 13. The pure water is applied through a discharge port 15 onto the substrate W by opening the valve 11 while the holding part 31 is rotated. The outer pipe of the pure water discharge nozzle 14 is connected in communication with the nitrogen source 26 through a pipe not shown. Nitrogen gas supplied through the pure water discharge nozzle 14 is applied through the discharge port 15 onto the substrate W.

The pure water discharge nozzle 14 has a similar construction (a rotary shaft 81 and a motor 82) to the removal solution discharge nozzle 24, as shown in FIG. 4, and is pivotable in the directions indicated by the double-headed arrow AR3 from a retracted position not shown to a discharge position in which the pure water is applied to the substrate W. The pure water discharge nozzle 14 is connected to a cylinder 84 through the rotary shaft 81, the motor 82 and a movable part 83 on the opposite side from the discharge port 15. The cylinder 84 is similar in construction to the cylinder 74. As with the removal solution discharge nozzle 24, the position of the pure water discharge nozzle 14 as seen in the directions indicated by the double-headed arrow AR4 is determined by the air pressure inside the cylinder 84 which in turn is determined by the amount of air supplied from a pump 87 through a valve 86a, a control valve 85a and a pipe 88 to the inside of the cylinder 84, and the amount of air emitted outwardly of the cylinder 84 through a control valve 85b, a valve 86b and the pipe 88.

The thermocontroller 17 is similar in construction to the thermocontroller 27, and is capable of adjusting the pure water flowing through the pipe 13 to a predetermined temperature, based on the temperature measured by a sensor 17a of the detector of the thermocontroller 17. The flow control valve 18 is similar in construction to the flow control valve 28, and is capable of adjusting the pure water flowing through the pipe 13 to a predetermined flow rate, based on the flow rate measured by a sensor 18a of the detector of the flow control valve 18.

The removal solution supplied from the removal solution source 22 to the substrate W and the pure water supplied from the pure-water source 12 to the substrate W are fed to not only the spin processing unit SR1 but also the spin processing units SR2 to SR4, as shown in FIG. 3. Likewise, the nitrogen gas from the nitrogen source 26 is fed through pipes not shown to the spin processing units SR2 to SR4.

An input unit 50 includes, for example, a liquid crystal touch panel serving as both a manual input part and a display part, and is attached to the outside of the substrate processing apparatus 1, as shown in FIG. 2. When the operator selects a substrate processing procedure displayed on the input unit 50, the control unit 60 reads predetermined processing procedure data to be described later from the processing procedure database 10 into a memory 61 to execute predetermined substrate processing in each spin processing unit SR in accordance with the processing procedure data.

The processing procedure database 10 is a database for storing a plurality of processing procedure data describing the procedure of executing substrate processing in the spin processing units SR1 to SR4. FIG. 5 shows an example of the processing procedure data stored in the processing procedure database 10. As shown in FIG. 5, the processing procedure database 10 has a plurality of fields ("Procedure ID," "Apparatus No.," "Processing Procedure Data ID," "Sequence No.," "Item ID," "Item Name" and "Reference Command Value").

"Procedure ID" is a value used to uniquely identify a predetermined record (a set of data along a row) among a plurality of records stored in the processing procedure database 10, and is automatically assigned to a new record when the new record is added. "Processing Procedure Data ID" is used to select predetermined processing procedure data among the plurality of processing procedure data stored in the processing procedure database 10.

"Item ID" is used to identify individual processes (e.g., the RPM of the motor 33 and the process of opening and closing the valves 11 and 22) performed in each spin processing unit SR. "Item Name" contains description about the substrate processing corresponding to "Item ID."

"Sequence No." is a value indicating the processing sequence of the plurality of processing procedure data, and is contained in each processing procedure data. The processes indicated by "Item ID" are executed in a sequence indicated by "Sequence No."

"Reference Command Value" is a value indicating a parameter of a substrate processing function specified by "Item ID." For example, "Procedure ID"="10012" means setting the RPM of the motor 33 at 3000 (rpm). For opening and closing of the valve 21 indicated by "Procedure ID"= "10014," "Reference Command Value"="1" indicates opening the valve, whereas "Reference Command Value"="0" indicates closing the valve.

"Apparatus No." is a value for identifying the substrate processing apparatus 1 to which the processing procedure data specified by "Processing Procedure Data ID" is applied. In this preferred embodiment, "Apparatus No."="90" is fixed since the processing procedure data stored in the processing procedure database 10 are used only in the substrate processing apparatus 1.

The process of extracting predetermined processing procedure data from the processing procedure database 10 includes: (1) determining "Processing Procedure Data ID" corresponding to a substrate processing procedure specified by the operator in the input unit 50 to extract records having the determined "Processing Procedure Data ID" from the processing procedure database 10; and (2) then rearranging the extracted records in ascending order of "Sequence No." to extract the processing procedure data. FIG. 6 shows an example of the processing procedure data with "Processing Procedure Data ID"="510" extracted from the processing procedure database 10 shown in FIG. 5. By the use of the processing procedure data extracted in the above-mentioned procedure in each substrate processing, the substrate processing designated by the data is performed.

These processing procedure data may be additionally stored in the processing procedure database 10 by the operator's entry using the input unit 50. Since the processing procedure database 10 is accessible by the apparatuses and servers outside the substrate processing apparatus 1 through the network 96, the processing procedure data may be additionally stored by the use of the apparatus server 90, the maintenance server 93 and the remote diagnosis apparatus 95.

As shown in FIG. 2, the control unit 60 includes the memory 61 for storing a program and variables, and a CPU 62 for effecting control in accordance with the program stored in the memory 61. In accordance with the program stored in the memory 61, the CPU 62 controls the RPM of the motor 33, the opening and closing of each valve, the temperature of the processing solution by means of each thermocontroller, the communication with the apparatuses and servers connected through the network 96, the access to the processing procedure database 10, and the like in predetermined timed relation.

<1.2.2. Construction of Apparatus Server>

The hardware construction of the apparatus server 90 is similar to that of a typical computer. As shown in FIG. 2, the apparatus server 90 principally comprises a control unit 92 for carrying out the computation and the like of the correction amounts for making the processing states to be described later substantially the same, and the correction amount database 90a for storing the correction amounts.

The correction amount database 90a stores correction amounts for the respective spin processing units SR to be described later in association with "Reference Command Value" shown in FIGS. 5 and 6. FIG. 7 shows an example of the construction of the correction amount database 90a stored in the apparatus server 90. As shown in FIG. 7, the correction amount database 90a has a plurality of fields ("Correction Amount ID," "Apparatus No.," "Item ID," "Item Name," "Reference Command Value," and "ΔSR1" to "ΔSR4"). "Correction Amount ID" is a value used to uniquely identify a predetermined record (a set of data along a row) among a plurality of records stored in the correction amount database 90a, and is automatically assigned to a new record when the new record is added.

"Item ID" and "Item Name" are similar to those included in the processing procedure database 10. "Item ID" contains values for identifying individual processes performed in the spin processing units SR. "Item Name" contains the description about the substrate processing corresponding to "Item ID". When "Item ID" stored in the processing procedure database 10 and "Item ID" stored in the correction amount database 90a are equal to each other, "Item ID" indicates the same substrate processing. For example, "Item ID" (="60" with reference to FIG. 5) corresponding to "Procedure ID"="10011" and "Item ID" (="60" with reference to FIG.

7) corresponding to "Correction Amount ID"="20102" have equal values both indicating "Setting of Thermocontroller 27."

"Apparatus No." is a value for identifying the substrate processing apparatus 1 to which the values in the respective fields specified by "Correction Amount ID" are applied. In this preferred embodiment, "Apparatus No."="90" is fixed since the correction amounts stored in the correction amount database 90a are used only in the substrate processing apparatus 1. When "Apparatus No." stored in the processing procedure database 10 and "Apparatus No." stored in the correction amount database 90a are equal to each other, "Apparatus No. " indicates the same substrate processing apparatus 1.

The correction amounts include four fields: "ΔSR1," "ΔSR2," "ΔSR3" and "ΔSR4." When substrate processing is performed on a plurality of substrates W in the respective spin processing units SR in parallel, the results of the substrate processing sometimes vary because of different installation environments (e.g., locations) of the respective spin processing units SR. For instance, the removal solution supplied from the removal solution source 22 to the substrate W is fed to not only the spin processing unit SR1 but also the spin processing units SR2 to SR4, as shown in FIG. 3. Different pipe lengths from the removal solution source 22 to the respective spin processing units SR1 to SR4 cause a difference between the spin processing units SR in discharge timing and discharge pressure of the removal solution fed through the pipe 23 and discharged from the discharge port 25 in each spin processing unit SR, resulting in variations between processing results of the respective substrates W processed in the spin processing units SR.

The first preferred embodiment solves the problem with such variations in a manner to be described below. For each record specified by "Correction Amount ID," a value set in the column of "Reference Command Value" is used as an operation parameter of the substrate processing function specified by "Item ID." The correction amounts "ΔSR1" to "ΔSR4" previously determined by experiment or the like plus "Reference Command Value" are used as control command values. The control command values are transmitted to the corresponding spin processing units SR so that the substrate processing states in the respective spin processing units SR are substantially the same (i.e., within tolerance with respect to "Reference Command Value"). In the case of "Correction Amount ID"="20103" as an example, the control command values of "3030," "3050," "2950" and "3012" are transmitted to the respective spin processing units SR1 to SR4 so as to bring the RPM of the motor 33 into correspondence with "Reference Command Value"="3000." The control command values used herein are transmitted to the respective spin processing units SR as the operation parameter values of the substrate processing function when executing the predetermined substrate processing specified by "Item ID." In some cases, only the reference command values are transmitted as the control command values.

The control unit 92 includes a memory 92a for storing a program and variables, and a CPU 92b for effecting control in accordance with the program stored in the memory 92a. In accordance with the program stored in the memory 92a, the CPU 92b controls the communication with the apparatuses and servers connected through the network 96, the access to the correction amount database 90a, and the like in predetermined timed relation.

A display 91a and a keyboard 91b are connected to the control unit 92. The operator can enter necessary information to the control unit 92 using the keyboard 91b in accordance with a description presented on the display 91a.

<1.3. Computation of Correction Amounts>

Figure 8:
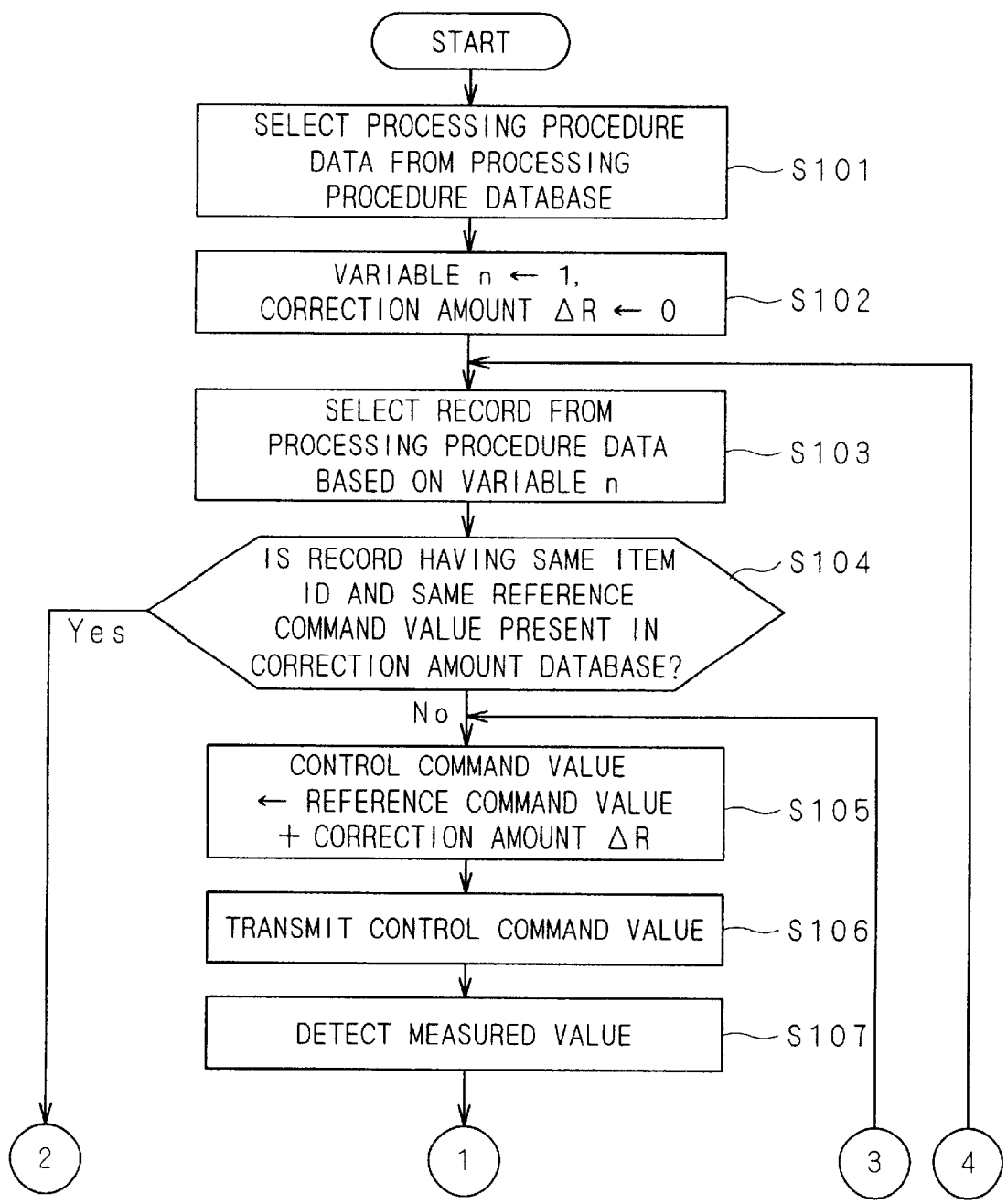
FIGS. 8 and 9 are flowcharts showing an example of a correction amount computation procedure in each spin processing unit according to the first preferred embodiment.
Figure 9:
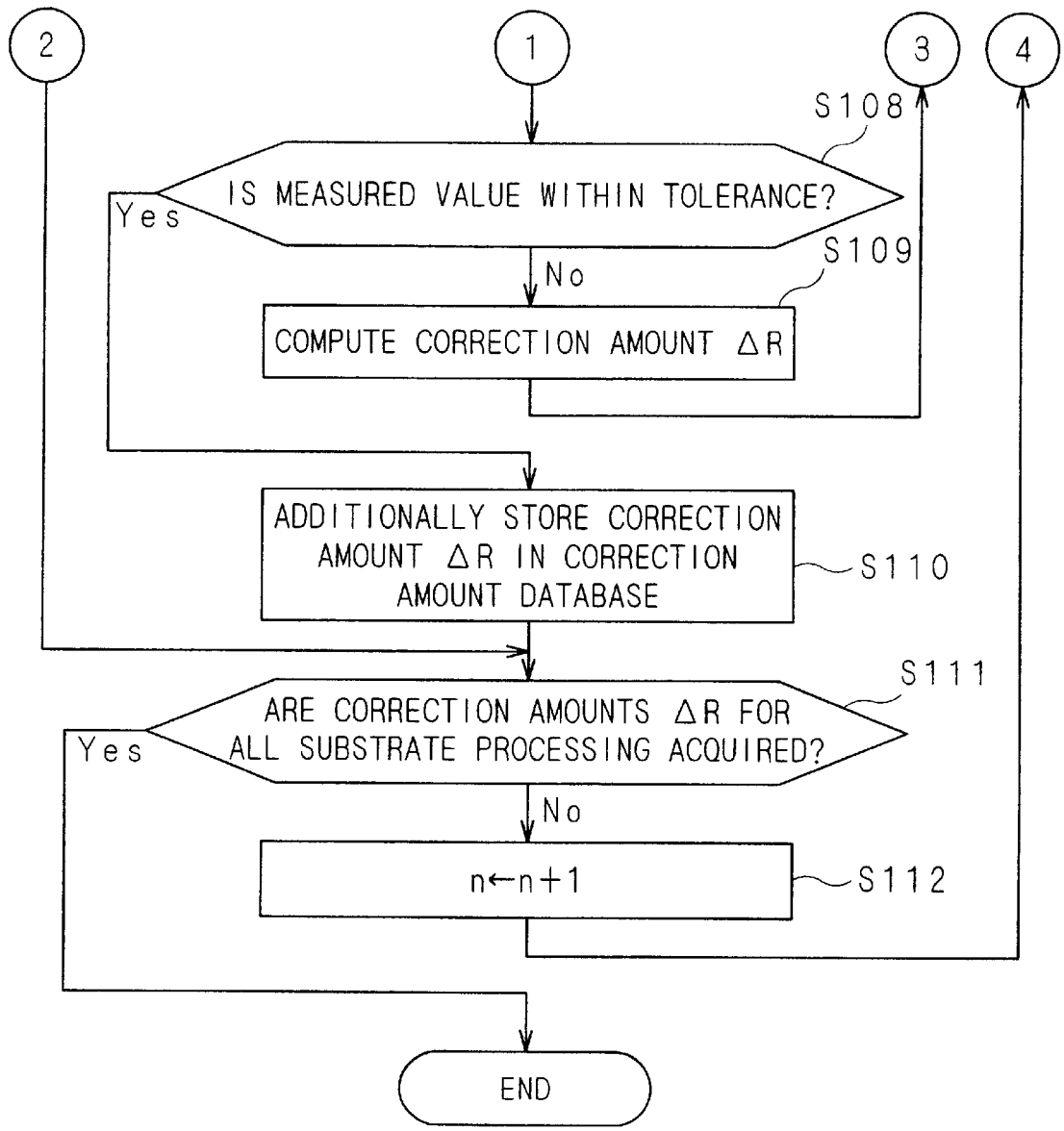

A procedure for computing the correction amounts for suppression of variations between substrates W processed in the respective spin processing units SR will be described. FIGS. 8 and 9 are flowcharts showing the procedure for computing the correction amounts for making the processing states in the respective spin processing units SR substantially the same. Since the correction amount computation is performed in a similar procedure in the spin processing units SR, the spin processing unit SR1 is taken as a representative in the following description.

In the correction amount computation, the operator first selects a substrate processing procedure using the keyboard 91b or a mouse not shown in accordance with the description on the display 91a. The control unit 92 determines "Processing Procedure Data ID" corresponding to the selected substrate processing procedure. Then, the control unit 92 makes connection to the substrate processing apparatus 1 through a network 96d to extract records having the determined "Processing Procedure Data ID" from the processing procedure database 10. Subsequently, the control unit 92 stores in the memory 92a the processing procedure data (See FIG. 6) including the extracted records rearranged in ascending order of "Sequence No." (in Step S101).

Next, the control unit 92 reserves an area for a variable n and a correction amount ΔR in the memory 92a, and initializes the variable n and the correction amount ΔR to n=1 and ΔR=0 (in Step S102). The variable n corresponds to "Sequence No." of the processing procedure data (referred to hereinafter as "target processing procedure data") stored in the memory 92a, and is used to select a record having "Sequence No." equal to the value of the variable n from the target processing procedure data. The correction amount ΔR is a variable for temporarily holding a computed value during the correction amount computation in Steps S105 to S109 to be described later. Next, the control unit 92 selects the record having "Sequence No." equal to the value of the variable n from the target processing procedure data to store the values of "Item ID" and "Reference Command Value" included in the selected record in the memory 92a (in Step S103).

Then, the control unit 92 searches the records stored in the correction amount database 90a (See FIG. 7) for a record including the values of "Item ID" and "Reference Command Value" equal to those of "Item ID" and "Reference Command Value" stored in the memory 92a (in Step S104). If a record including the above-mentioned values is present in the correction amount database 90a, another processing procedure data including the same substrate processing and the same reference command value has already been stored in the substrate processing apparatus 1, and the correction amount computation has already been performed. Then, the processing proceeds to Step S111 to be described later without performing the correction amount computation. In this manner, if the record including the same "Item ID" and the same "Reference Command Value" is stored in the correction amount database 90a in Step S104, the computation of the correction amounts "ΔSR1" to "ΔSR4" is not newly performed. This shortens the time to determine the correction amounts, and also prevents the additional storage of the same correction amounts in the correction amount database 90a. On the other hand, if the record including the above-mentioned values is not present, that is, if the record including the same "Item ID" and the same "Reference Command Value" is not stored in the correction amount database 90a, the processes in Steps S105 to S109 are repeatedly performed to compute the correction amount ΔR.

Next, the control unit 92 adds the correction amount ΔR to the reference command value stored in the memory 92a to produce the control command value (in Step S105). Then, the control unit 92 transmits the control command value and "Item ID" stored in the memory 92a through the network 96d to the spin processing unit SR1 to perform the substrate processing specified by "Item ID" using a parameter specified by the control command value (in Step S106). Next, during the substrate processing specified by "Item ID", a measured value indicating an actual substrate processing state is detected by a sensor (e.g., the encoder 33a of the motor 33, the sensors 17a, 27a of the thermocontrollers 17, 27, the sensors 18a, 28a of the flow control valves 18, 28, and detectors of the control valves 75a, 75b, 85a, 85b) provided in the spin processing unit SR1, and is transmitted to the apparatus server 90 (in Step S107). Then, the control unit 92 determines whether or not the measured value detected by the sensor is within predetermined tolerance with respect to "Reference Command Value" stored in the memory 92a (in Step S108). If the measured value is out of the predetermined tolerance, the control unit 92 judges that the measured value and the reference command value are not substantially the same, and computes the correction amount ΔR (in Step S109). Then, the processing returns to Step S105. A variety of methods of computing the correction amount ΔR can be considered. An example of the methods is to hold a value (S−P+ΔR) as a new correction amount ΔR where S is "Reference Command Value" stored in the memory 92a, and P is the measured value.

On the other hand, if the measured value detected in Step S108 is within the predetermined tolerance, a new record is added to the correction amount database 90a. The new record contains the following: "90" as "Apparatus No."; "Item ID" stored in the memory 92a as "Item ID"; "Item Name" corresponding to "Item ID" as "Item Name"; and the correction amount ΔR stored in the memory 92a as the correction amount "ΔSR1" (in Step S110). Since a unique value is automatically applied to "Correction Amount ID" when the new record is added, the computation process in this preferred embodiment neither generates nor stores a new value as "Correction Amount ID." If the correction amount computation for all of the substrate processing included in the target processing procedure data has not yet been completed (in Step S111), the variable n is incremented by one (in Step S112). Then, the processing returns to Step S103 for execution of the process of computing the correction amount for the substrate processing specified by a different value of "Item ID." If the computation for all of the substrate processing has been completed, the process of correction amount computation is terminated.

<1.4. Substrate Processing Procedure>

Figure 10:
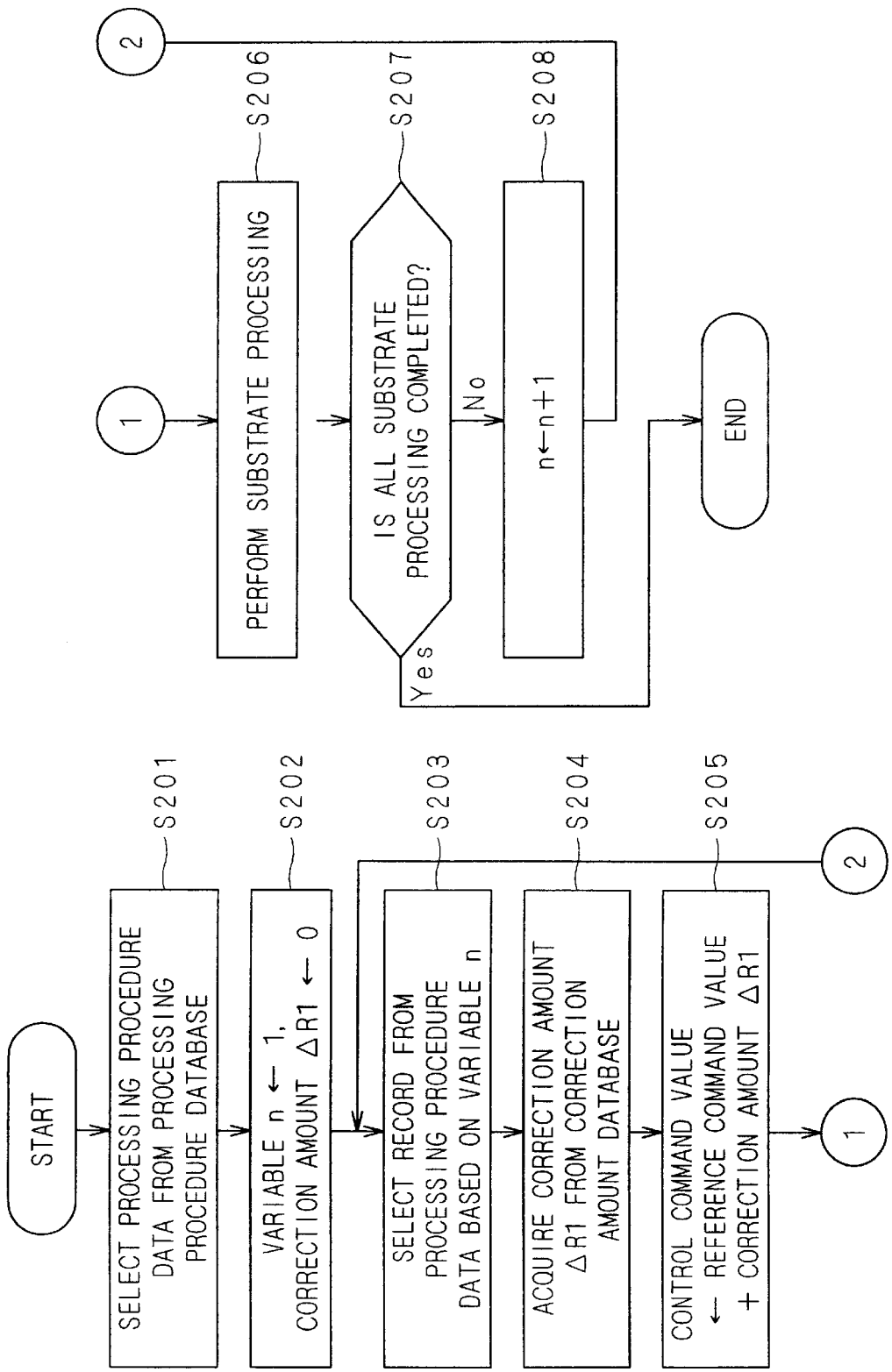
FIG. 10 is a flowchart showing an example of a substrate processing procedure in each spin processing unit according to the first preferred embodiment.

The substrate processing procedure for making the substrate processing states in the respective spin processing units SR substantially the same by the use of the correction amounts stored in the correction amount database 90a will be described. FIG. 10 shows an example of the substrate processing procedure using the correction amounts stored in the correction amount database 90a. Since the substrate processing procedure is performed in a similar procedure in the spin processing units SR, the spin processing unit SR1 is taken as a representative in the following description.

In the substrate processing procedure, the operator first selects a substrate processing procedure by using the input unit 50. The control unit 60 determines "Processing Procedure Data ID" corresponding to the selected substrate processing procedure, and extracts records having the determined "Processing Procedure Data ID" from the processing procedure database 10. Subsequently, the control unit 60 stores in the memory 61 the processing procedure data (See FIG. 6) including the extracted records rearranged in ascending order of "Sequence No." (in Step S201).

Next, the control unit 60 reserves an area for a variable n and a correction amount ΔR1 in the memory 61, and initializes the variable n and the correction amount ΔR1 to n=1 and ΔR1=0 (in Step S202). As in the correction amount computation, the variable n corresponds to "Sequence No." of the processing procedure data (referred to hereinafter as "target processing procedure data") stored in the memory 61, and is used to select a record having "Sequence No." equal to the value of the variable n from the target processing procedure data. The correction amount ΔR1 is stored in the correction amount database 90a, and is a variable for temporarily holding the value of the correction amount "ΔSR1" to be acquired in Step S204 to be described later. Next, the control unit 60 selects the record having "Sequence No." equal to the value of the variable n from the target processing procedure data to store the values of "Item ID" and "Reference Command Value" included in the selected record in the memory 61 (in Step S203).

Next, the control unit 60 makes connection to the apparatus server 90 through the network 96d. Then, the control unit 60 searches the records stored in the correction amount database 90a (See FIG. 7) to compare the values of "Item ID" and "Reference Command Value" stored in the memory 61 with the values of "Item ID" and "Reference Command Value" in each record of the correction amount database 90a, thereby selecting from the correction amount database 90a a record including the values of "Item ID" and "Reference Command Value" equal to those of "Item ID" and "Reference Command Value" stored in the memory 61 (in Step S203). The control unit 60 acquires the value of the correction amount "ΔSR1" from the selected record to hold the value as the correction amount ΔR1 (in Step S204).

Next, the control unit 60 adds the correction amount ΔR1 acquired in Step S204 to "Reference Command Value" stored in the memory 61 in Step S203 to produce a control command value (in Step S205). The spin processing unit SR1 receives the control command value and "Item ID" stored in the memory 61 in Step S203 from the control unit 60 to perform predetermined substrate processing specified by "Item ID" using a predetermined value specified by the control command value (in Step S206).

The substrate processing proceeds progressively by repeating Steps S203 to S206 described above. If not all of the substrate processing included in the target processing procedure data has yet been completed (in Step S207), the variable n is incremented by one (in Step S208). Then, the processing returns to Step S203 for execution of the substrate processing specified by a different value of "Item ID." If all of the substrate processing has been completed, the substrate processing is terminated.

<1.5. Advantages of Substrate Processing Apparatus of First Preferred Embodiment>

In each of the spin processing units SR of the substrate processing apparatus 1 according to the first preferred embodiment as described above, the substrate processing specified by "Item ID" is performed using the value specified by "Reference Command Value." Additionally, the measured values indicating the substrate processing states in the spin processing units SR are obtained, and the correction amounts for making the processing states in the respective spin processing units SR substantially the same are computed from "Reference Command Value" and the measured values for the respective spin processing units SR. Therefore, the substrate processing apparatus 1 can reduce the operations for obtaining the correction amounts which have conventionally been obtained by an operator through experiments or the like. This makes the processing states in the respective spin processing units SR substantially the same while shortening the time for startup of the substrate processing apparatus and the time for changeover in substrate processing.

Additionally storing "Reference Command Value" of the substrate processing specified by "Item ID" in association with the correction amount for each spin processing unit SR in the correction amount database 90a as shown in FIG. 7 accomplishes the management of the substrate processing in the spin processing units SR by the use of the single "Reference Command Value."

<2. Second Preferred Embodiment>

In the first preferred embodiment, description has been given on the technique of computing the correction amounts for making the processing states in the respective spin processing units SR of the substrate processing apparatus substantially the same, from "Reference Command Value" and the measured values, although the correction amounts have conventionally been obtained by the operator through experiments or the like. This technique therefore makes the processing states in the respective spin processing units SR substantially the same while solving the background art problems of the increase in time and labor for the operator to operate during the startup of the substrate processing apparatus and during the changeover in substrate processing which results in the increased manufacturing costs of semiconductor devices.

However, the above-mentioned problems also arise not only when making the processing states in the respective spin processing units SR substantially the same but also when the operator obtains correction amounts for making substrate processing environments of respective substrate processing apparatuses substantially the same.

In a second preferred embodiment according to the present invention, description will be given on a technique for making the processing environments of respective substrate processing apparatuses substantially the same without the increase in time and labor for an operator to operate in a substrate processing system having the plurality of substrate processing apparatuses for performing the same substrate processing.

<2.1. General Construction of Substrate Processing System>

Figure 11:
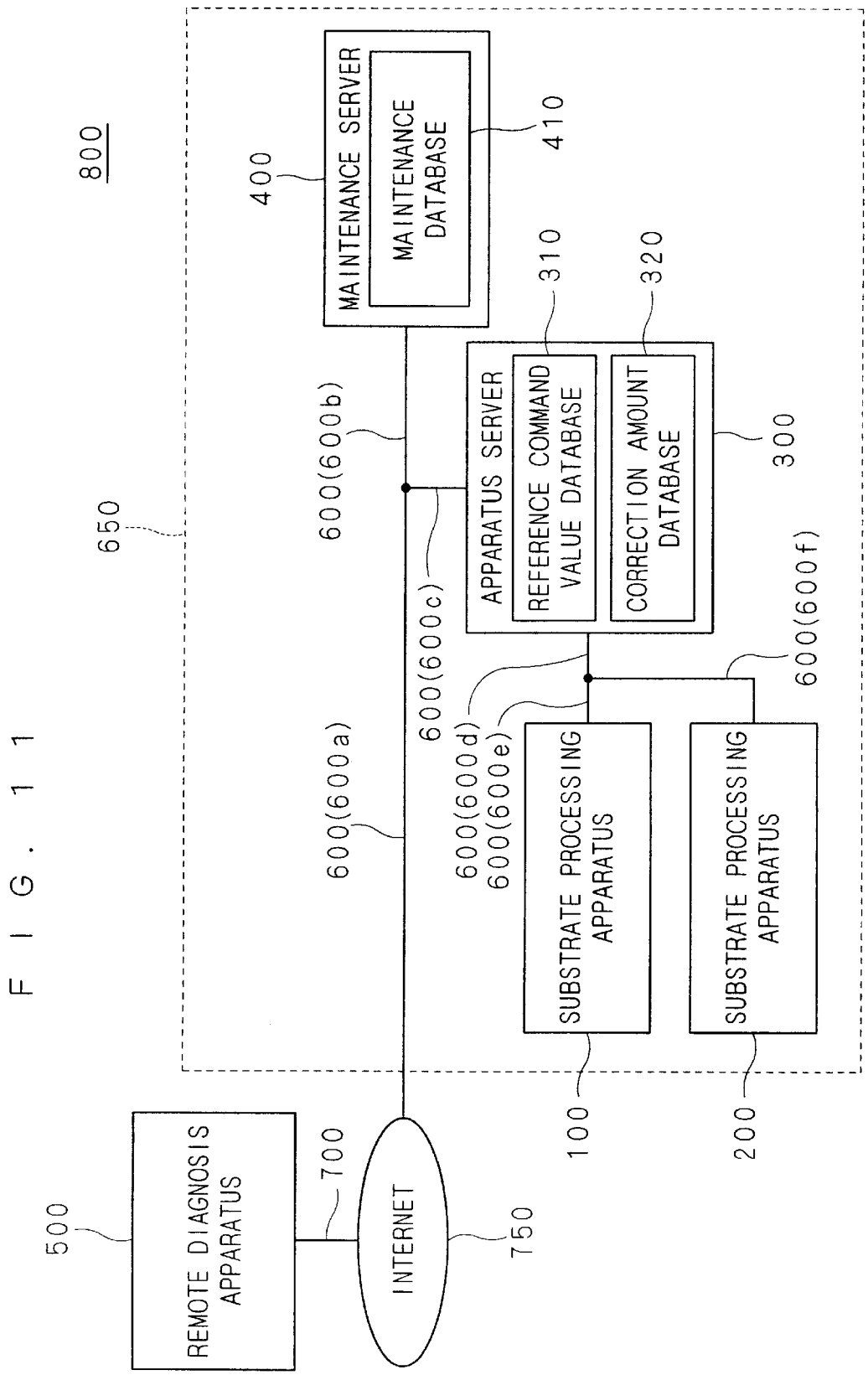
FIG. 11 is a diagram of the substrate processing system according to a second preferred embodiment of the present invention.

FIG. 11 is a block diagram showing the construction of a substrate processing system 800 according to the second preferred embodiment of the present invention. As shown in FIG. 11, the substrate processing system 800 principally comprises: a plurality of substrate processing apparatuses 100 and 200 for performing the polymer removal process; a maintenance server 400 for storing and analyzing the processing state of each substrate processed in the substrate processing apparatuses 100 and 200 and the use of the substrate processing apparatuses 100 and 200; an apparatus server 300 for carrying out computation and the like of correction amounts for making the substrate processing environments of the respective substrate processing apparatuses 100 and 200 substantially the same; and a network 600 for establishing connection between the substrate processing apparatuses 100 and 200, the apparatus server 300 and the maintenance server 400. These components 100, 200, 400, 300 and 600 of the substrate processing system 800 are installed in the same semiconductor manufacturing factory (referred to simply as a factory hereinafter) 650.

The substrate processing environments termed herein include atmosphere conditions (e.g., the cleanliness of an atmosphere produced by a filter fan unit FFU to be described later, a downflow condition formed by the filter fan unit FFU, the forced air extraction of an atmosphere using an exhaust unit VC) in the substrate processing apparatuses, and the pressures of a fluid (e.g., nitrogen gas and pure water) in individual pipes, the fluid being supplied from a common fluid source (e.g., a common nitrogen gas source 612 and a common pure water source 622 to be described later) installed in the factory 650 through a common pipe to the individual pipes included in the substrate processing apparatuses. Fluctuations in atmosphere conditions and in fluid pressures cause variations between the substrate processing results produced by the respective substrate processing apparatuses or result in poor substrate processing results. Therefore, the values indicating the atmosphere conditions, the fluid pressure values and the like are important parameters which exert influences upon the substrate processing results.

The hardware construction of the maintenance server 400 is similar to that of a typical computer. The maintenance server 400 stores in a maintenance database 410 data (referred to hereinafter as "processing state data") indicating the processing states of substrates subjected to various processes in the substrate processing apparatuses 100 and 200, and analyzes the processing states and processing results of the substrates based on the data. The processing state data (e.g., discharge pressure history of a liquid chemical applied to the substrates) about the substrates processed in the substrate processing apparatuses 100 and 200 is transmitted through the network 600 and to the apparatus server 300, is subjected to processing in the apparatus server 300, and is stored in the maintenance database 410 of the maintenance server 400.

The processing state data stored in the maintenance database 410 has a substrate identifier appended thereto for uniquely identifying each substrate processed in the substrate processing apparatuses 100 and 200. By the use of substrate processing state analysis software incorporated in the maintenance server 400, an operator can extract the processing state data about a particular substrate identified by the substrate identifier from the maintenance database 410 to check up on the current processing state of the particular substrate, and, if a processing failure occurs in a substrate, can analyze in which step the cause of the processing failure arises, based on the processing state data extracted from the maintenance database 410.

A remote diagnosis apparatus 500 is installed in a location other than the factory 650, and is connected to the substrate processing apparatuses 100, 200, the apparatus server 300 and the maintenance server 400 in the factory 650 through a local network 700, the Internet 750 which is a wide area network and the intra-factory network 600. Substrate processing state analysis software similar to that in the maintenance server 400 is incorporated in the remote diagnosis apparatus 500. Thus, an operator at the location of the remote diagnosis apparatus 500 can check up on the processing state of a substrate processed in the substrate processing apparatuses 100 and 200 in the factory 650 and analyze the processing result thereof.

<2.2. Constructions of Substrate Processing Apparatuses and Apparatus Server>

Figure 12:
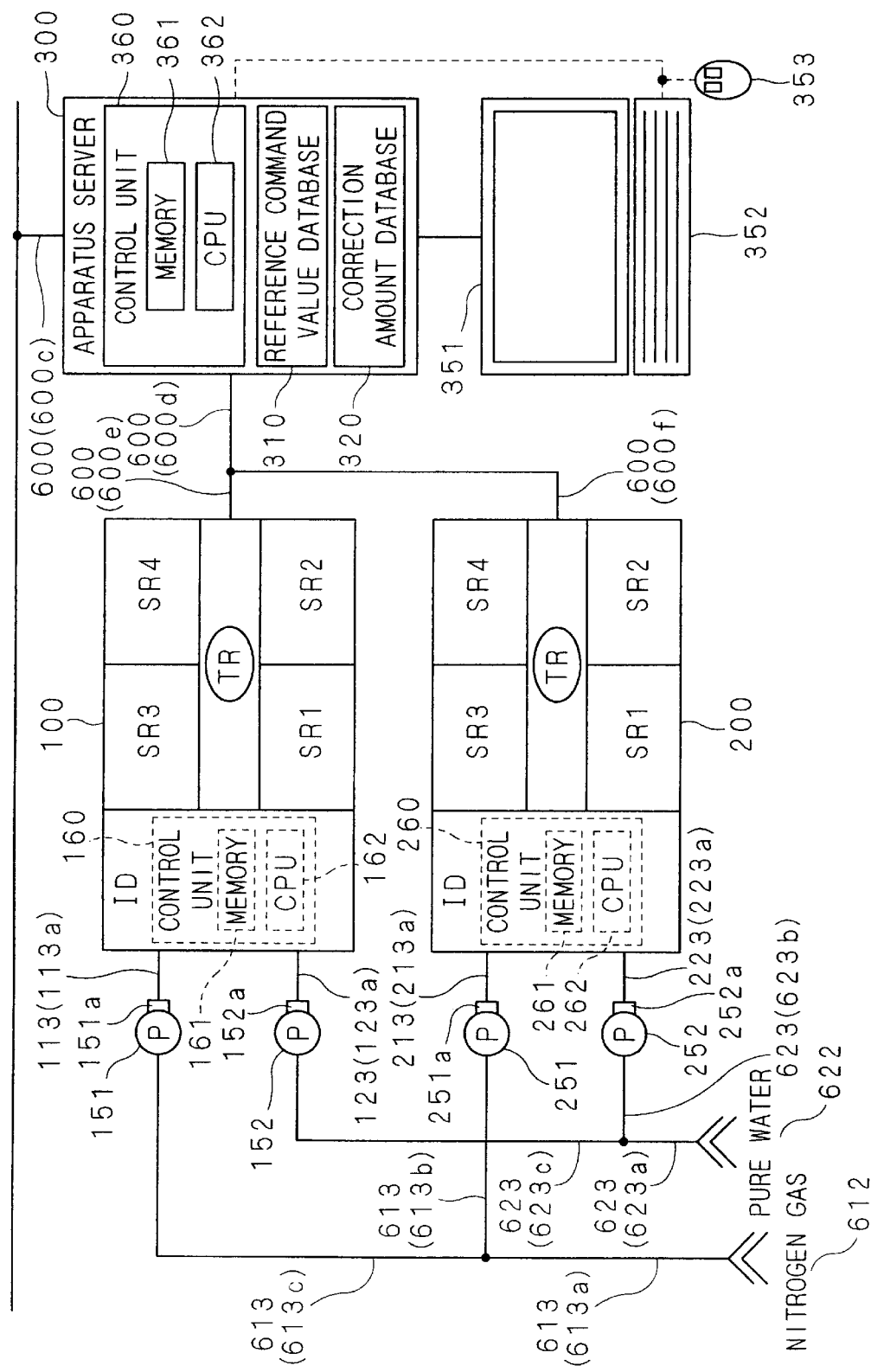
FIG. 12 shows the constructions of the substrate processing apparatus and the apparatus server according to the second preferred embodiment.

FIG. 12 shows the constructions of the substrate processing apparatuses 100, 200 and the apparatus server 300. Description will be given first on the construction of the substrate processing apparatuses 100 and 200 for performing the polymer removal process, and then on the apparatus server 300 for computing and storing the correction amounts for making the substrate processing environments of the respective substrate processing apparatuses 100 and 200 substantially the same.

<2.2.1. Construction of Substrate Processing Apparatuses>

The construction of the substrate processing apparatuses 100 and 200 will be described. Although only the substrate processing apparatus 100, which is similar in internal construction to the substrate processing apparatus 200, will be described herein, pipes for supplying nitrogen gas, pure water and the like to the respective substrate processing apparatuses 100 and 200 have different lengths, resulting in a functional numeric difference (to be described later).

The substrate processing apparatus 100 is intended to perform the polymer removal process for removing a polymer residue which is part of a resist film spattered, deposited on the bottom and side walls of a wiring pattern, and hardened in the process of dry etching using the resist film as a mask. As shown in FIG. 12, the substrate processing apparatus 100 principally comprises the plurality of spin processing units SR1 to SR4, the indexer ID, and the transport robot TR.

The indexer ID places thereon a cassette or carrier (not shown) which can accommodate a plurality of substrates, and includes a mobile robot. The indexer ID transfers an unprocessed substrate from the cassette to the transport robot TR and receives a processed substrate from the transport robot TR to store the processed substrate in the cassette.

Figure 13:
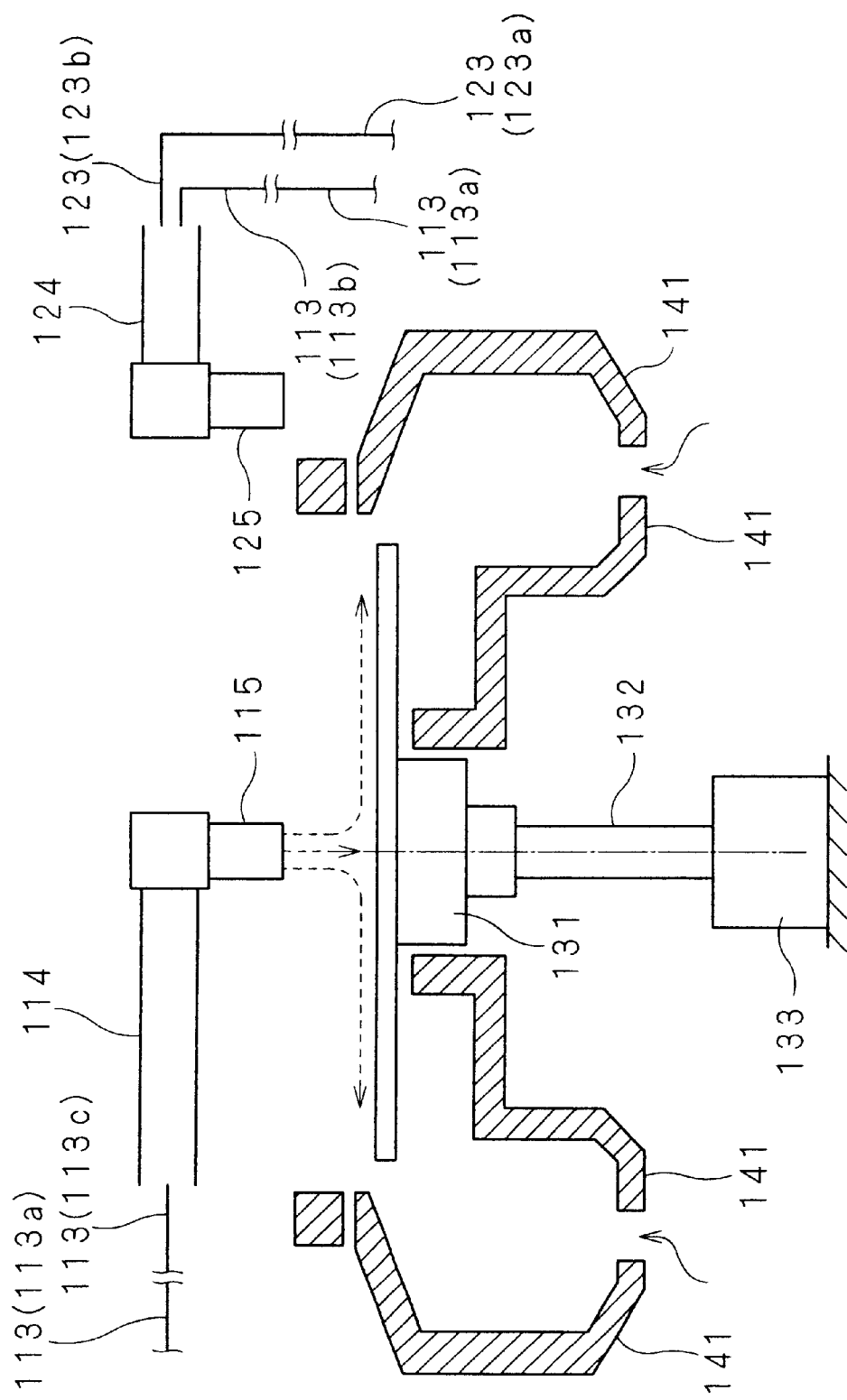
FIG. 13 shows the construction of the spin processing unit according to the second preferred embodiment.

FIG. 13 shows the construction of the spin processing unit SR1 in the substrate processing apparatus 100. Since the spin processing unit SR1 is similar in internal construction to the spin processing units SR2 to SR4, only the spin processing unit SR1 will be described herein.

The spin processing unit SR1 is a unit for applying the processing solution to a substrate while spinning or rotating the substrate to remove the polymer residue from the substrate. A holding part 131 holds the substrate W in a substantially horizontal position thereon under suction. The lower surface of the holding part 131 is fixed to the upper end of a rotary shaft 132 of a motor 133 for rotating the substrate W about a vertical axis.

A vertically movable cup 141 of circular cross-sectional configuration is provided around the holding part 131 in such a manner as to surround the substrate W to prevent the processing solution applied to the substrate W from spattering outwardly of the spin processing unit SR1.

A removal solution discharge nozzle 114 is connected in communication with a removal solution source (not shown) through a pipe not shown. The removal solution is applied through a discharge port 115 onto the substrate W while the holding part 131 is rotated. The removal solution used herein refers to a polymer removal solution for selectively removing only the polymer residue deposited on the bottom and side walls of a wiring pattern formed on a substrate.

The removal solution discharge nozzle 114 is connected in communication with the common nitrogen gas source 612 through a pipe 113 (113a, 113c), a pump 151 and a common pipe 613 (See FIG. 12). Nitrogen gas is applied through the discharge port 115 onto the substrate W. The common nitrogen gas source 612 is installed in a predetermined location inside the factory 650 to supply the nitrogen gas through the common pipe 613 provided in the factory 650 to the substrate processing apparatuses provided in the factory 650.

As shown in FIG. 12, the pump 151 is connected in communication with the pipes 613c and 113a, and includes a detector having a sensor 151a for detecting the pressure value of the nitrogen gas flowing through the pipe 113, and a controller for controlling the pressure value of the nitrogen gas flowing through a pipe 113b, based on a command value transmitted from a control unit 160 to be described later. Thus, the nitrogen gas flowing through the pipe 113a is adjusted to a predetermined pressure value, based on the pressure value measured by the detector of the pump 151.

As shown in FIG. 13, a pure water discharge nozzle 124 is connected in communication with the common pure water source 622 through a pipe 123, a pump 152 and a common pipe 623. Pure water is applied through a discharge port 125 onto the substrate W while the holding part 131 is rotated. Like the common nitrogen gas source 612, the common pure water source 622 is installed in a predetermined location inside the factory 650 to supply the pure water through the common pipe 623 provided in the factory 650 to the substrate processing apparatuses provided in the factory 650.

The pump 152 is connected in communication with the pipes 623c and 123a, and includes a detector having a sensor 152a for detecting the pressure value of the pure water flowing through the pipe 123, and a controller for controlling the pressure value of the pure water flowing through the pipe 123a, based on a command value transmitted from the control unit 160 to be described later. Thus, the pure water flowing through the pipe 123a is adjusted to a predetermined pressure value, based on the pressure value measured by the detector of the pump 152.

The pure water discharge nozzle 124 is connected in communication with the common nitrogen gas source 612 through the pipe 113 (113a, 113b), the pump 151 and the common pipe 613. The nitrogen gas is applied through the discharge port 125 onto the substrate W.

Figure 14:
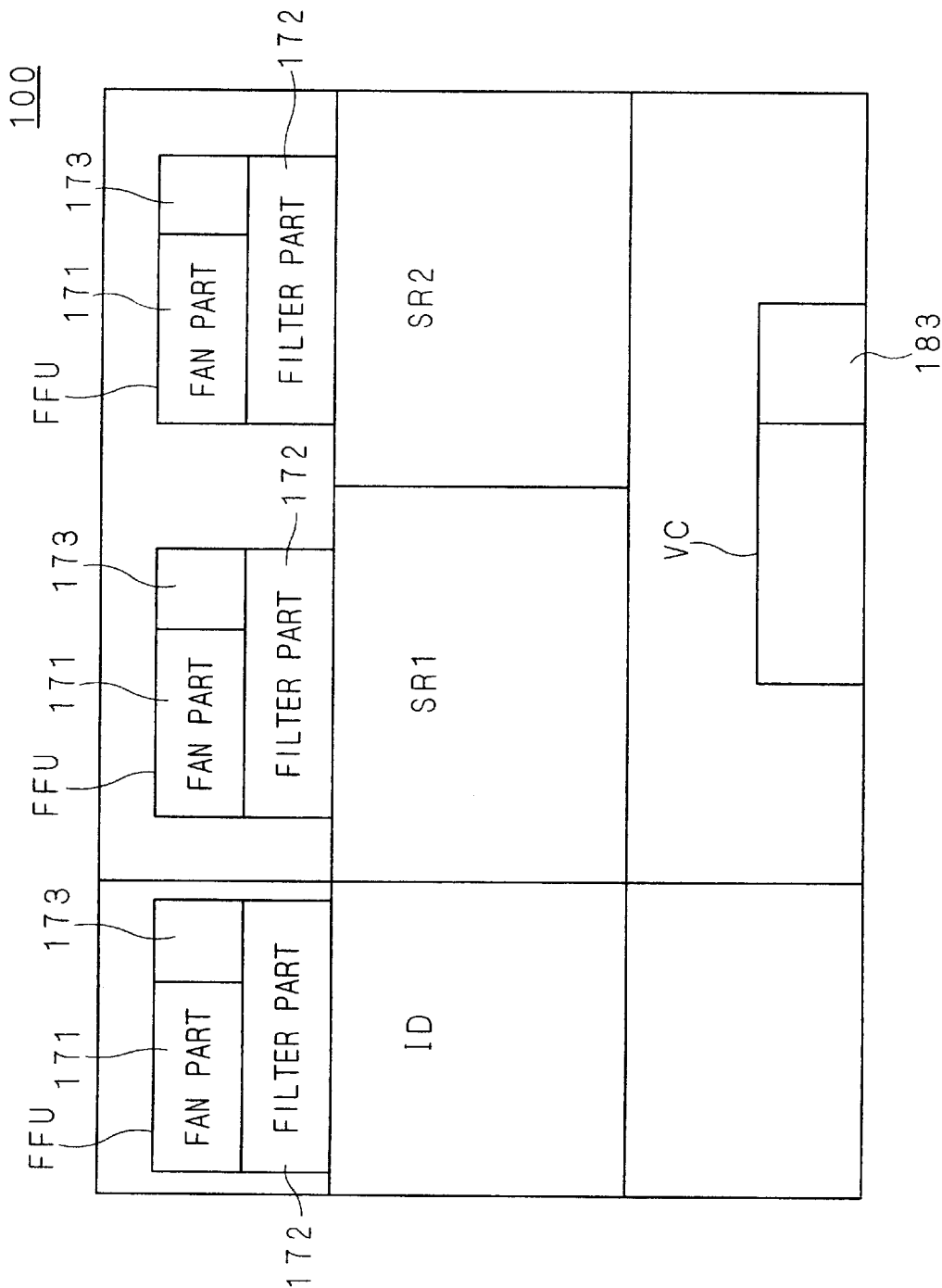
FIG. 14 shows the construction of the substrate processing apparatus according to the second preferred embodiment.

Referring to FIG. 14, a filter fan unit FFU is disposed on top of each of the indexer ID and the spin processing units SR1 to SR4 (although filter fan units FFU on top of the spin processing units SR3 and SR4 are not shown), and principally comprises a fan part 171, a filter part 172 and a sensor 173.

Air taken from within a cleanroom in which the substrate processing apparatus 100 is disposed into each filter fan unit FFU is turned into a downward air flow by rotating a fan (not shown) of the fan part 171. Then, the filter part 172 disposed under the fan part 171 removes particles contained in the air flow to produce a clean air flow. Thus, the filter fan unit FFU forms a downflow of clean air in each of the indexer ID and the spin processing units SR1 to SR4. The filter fan unit FFU is provided with the sensor 173 for detecting the operating state of the fan part 171. The state of the downflow of clean air formed in each of the indexer ID and the spin processing units SR1 to SR4 is adjusted by transmitting a command value set based on a detected value measured by the sensor 173 to the fan part 171 and controlling the fan part 171 to a predetermined state.

The exhaust unit VC is disposed under the indexer ID and the spin processing units SR1 to SR4 in the substrate processing apparatus 100 to exhaust the clean air supplied by the filter fan units FFU to the indexer ID and the spin processing units SR1 to SR4 outwardly from the substrate processing apparatus 100. The exhaust unit VC includes a detector having a sensor 183 for detecting an exhaust pressure at which the clean air is exhausted outwardly from the substrate processing apparatus 100, and a controller for controlling the exhaust pressure, based on a command value transmitted from the control unit 160. Thus, the exhaust pressure at which the clean air is exhausted outwardly from the substrate processing apparatus 100 is adjusted to a predetermined value, based on the exhaust pressure measured by the sensor 183.

As shown in FIG. 12, the control unit 160 includes a memory 161 for storing a program and variables, and a CPU 162 for effecting control in accordance with the program stored in the memory 161. In accordance with the program stored in the memory 161, the CPU 162 controls the RPM of the motor 133, the pressure of each pump, the fan part of each filter fan unit FFU, the exhaust pressure of the exhaust unit VC, the communication with the apparatuses and servers connected through the network 600, and the like in predetermined timed relation.

<2.2.2. Construction of Apparatus Server>

The hardware construction of the apparatus server 300 is similar to that of a typical computer. As shown in FIG. 12, the apparatus server 300 principally comprises: a control unit 360 for carrying out the computation and the like of the correction amounts for making the substrate processing environments of the respective substrate processing apparatuses 100 and 200 substantially the same; a reference command value database 310 for storing reference command values to be used as a control command value for controlling the substrate processing environment of the substrate processing apparatus 100; and a correction amount database 320 for storing the correction amounts for making the substrate processing environment of the substrate processing apparatus 200 substantially the same as that of the substrate processing apparatus 100.

The reference command value database 310 stores data about the substrate processing environment which exerts influence upon a result of substrate processing performed in the substrate processing apparatus 100. FIG. 15 shows an example of the construction of the reference command value database 310. As shown in FIG. 15, the reference command value database 310 has a plurality of fields ("Item ID," "Apparatus No.," "Item Name," and "Reference Command Value").

"Item ID" is used to uniquely identify a predetermined record (a set of data along a row) among a plurality of records stored in the reference command value database 310, and is automatically assigned to a new record when the new record is added. "Item Name" contains the description about the substrate processing environment for the record specified by "Item ID."

"Reference Command Value" is a parameter (also referred to hereinafter as an "environment parameter") for setting the substrate processing environment specified by each "Item ID." More specifically, "Reference Command Value" is an operation parameter of a device (e.g., pumps 251, 252, the filter fan units FFU, the exhaust unit VC and the like; see FIGS. 13 and 14) (also referred to hereinafter as an "environment control device") for controlling the substrate processing environment to be described later. For example, "Item ID"="1" means setting the downflow state by means of the filter fan unit FFU at "30."

"Apparatus No." is a value for identifying the substrate processing apparatus to which the substrate processing environment specified by "Item ID" is applied. In this preferred embodiment, "Apparatus No."="100" indicating the substrate processing apparatus 100 is fixed since the data stored in the reference command value database 310 are used only for the substrate processing environment of the substrate processing apparatus 100.

The correction amount database 320 stores the correction amounts for making the substrate processing environment of the substrate processing apparatus 200 substantially the same as that of the substrate processing apparatus 100 in association with "Reference Command Value" shown in FIG. 15. FIG. 16 shows an example of the construction of the correction amount database 320 stored in the apparatus server 300. As shown in FIG. 16, the correction amount database 320 has a plurality of fields ("Correction Amount ID," "Apparatus No.," "Item ID," and "Correction Amount"). "Correction Amount ID" is a value used to uniquely identify a predetermined record (a set of data along a row) among a plurality of records stored in the correction amount database 320, and is automatically assigned to a new record when the new record is added.

"Item ID" is similar to that included in the reference command value database 310. "Item ID" contains values for identifying respective substrate processing environments. When "Item ID" stored in the reference command value database 310 and "Item ID" stored in the correction amount database 320 are equal to each other, "Item ID" indicates the same substrate environment. For example, since "Item ID"="4" (See FIG. 16) when "Correction Amount ID"="10104" in the correction amount database 320, "Correction Amount" holds the correction amount of the pressure of pure water in the pump 152.

"Apparatus No." is a value for identifying the substrate processing apparatus to which the correction amount of the substrate processing environment specified by "Item ID" and "Correction Amount" is applied. In this preferred embodiment, "Apparatus No."="200" indicating the substrate processing apparatus 200 is fixed since the data stored in the correction amount database 320 are used only for the substrate processing apparatus 200. When "Apparatus No." stored in the reference command value database 310 and "Apparatus No." stored in the correction amount database 320 are equal to each other, "Apparatus No." indicates the same substrate processing apparatus.

"Correction Amount" contains the correction amount for making the substrate processing environment of the substrate processing apparatus 200 substantially the same as that of the substrate processing apparatus 100. When substrates W are processed in respective substrate processing apparatuses, different installation environments of the respective substrate processing apparatuses might cause different substrate processing environments, resulting in variations between the processing results of the substrates W in the respective substrate processing apparatuses. For instance, pure water supplied from the common pure water source 622 is fed through the common pipe 623 to the substrate processing apparatuses 100 and 200, as shown in FIG. 12. However, there is a difference in pipe length between the common pipe 623 (623a, 623c) extending from the common pure water source 622 to the pump 152 of the substrate processing apparatus 100 and the common pipe 623 (623a, 623b) extending from the common pure water source 622 to the pump 252 of the substrate processing apparatus 200. The pipe length difference causes a difference between the pressure value of the pure water in the pipe 123a detected by the sensor 152a and the pressure value of the pure water in a pipe 223a detected by a sensor 252a. This results in variations in processing result between the substrate W processed in the substrate processing apparatus 100 and the substrate W processed in the substrate processing apparatus 200.

The second preferred embodiment solves the problem with such variations in a manner to be described below. For each record specified by "Correction Amount ID" in the correction amount database 320, the following three values are extracted from the correction amount database 320: a value (referred to hereinafter as specific "Item ID") set in the column of "Item ID," a value (referred to hereinafter as specific "Apparatus No.") set in the column of "Apparatus No.," and a value of "Correction Amount" (referred to hereinafter as specific "Correction Amount") previously determined by experiment or the like. Next, a record including the same "Item ID" as specific "Item ID" is selected from the reference command value database 310, and a value (referred to hereinafter as specific "Reference Command Value") set in the column of "Reference Command Value" in the selected record is extracted from the reference command value database 310. Then, specific "Correction Amount" is added to specific "Reference Command Value" to produce a control command value. The control command value is transmitted to the substrate processing apparatus (in this case, the substrate processing apparatus 200) specified by specific "Apparatus No." so that the substrate processing environment specified by specific "Item ID" for the substrate processing apparatus 200 is substantially the same as the substrate processing environment of the substrate processing apparatus 100 (i.e., within tolerance with respect to specific "Reference Command Value").

In the case of "Correction Amount ID"="10103" as an example, the control command value of "20.5" is transmitted to the substrate processing apparatus 200 for correspondence with "Reference Command Value"="20" indicating the pressure value of nitrogen gas supplied from the common nitrogen gas source 612 to the substrate processing apparatus 100. The control command value used herein is transmitted to the substrate processing apparatuses 100 and 200 as a parameter value for setting the substrate processing environment thereof. In some cases, only the reference command value is transmitted as the control command value.

The control unit 360 includes a memory 361 for storing a program and variables, and a CPU 362 for effecting control in accordance with the program stored in the memory 361. In accordance with the program stored in the memory 361, the CPU 362 controls the communication with the apparatuses and servers connected through the network 600, the access to the reference command value database 310 and the correction amount database 320, and the like in predetermined timed relation.

A display 351, a keyboard 352 and a mouse 353 are connected to the control unit 360. The operator can enter necessary information to the control unit 360 using the keyboard 352 and the mouse 353 in accordance with a description presented on the display 351.

<2.3. Computation of Correction Amounts>

Figure 17:
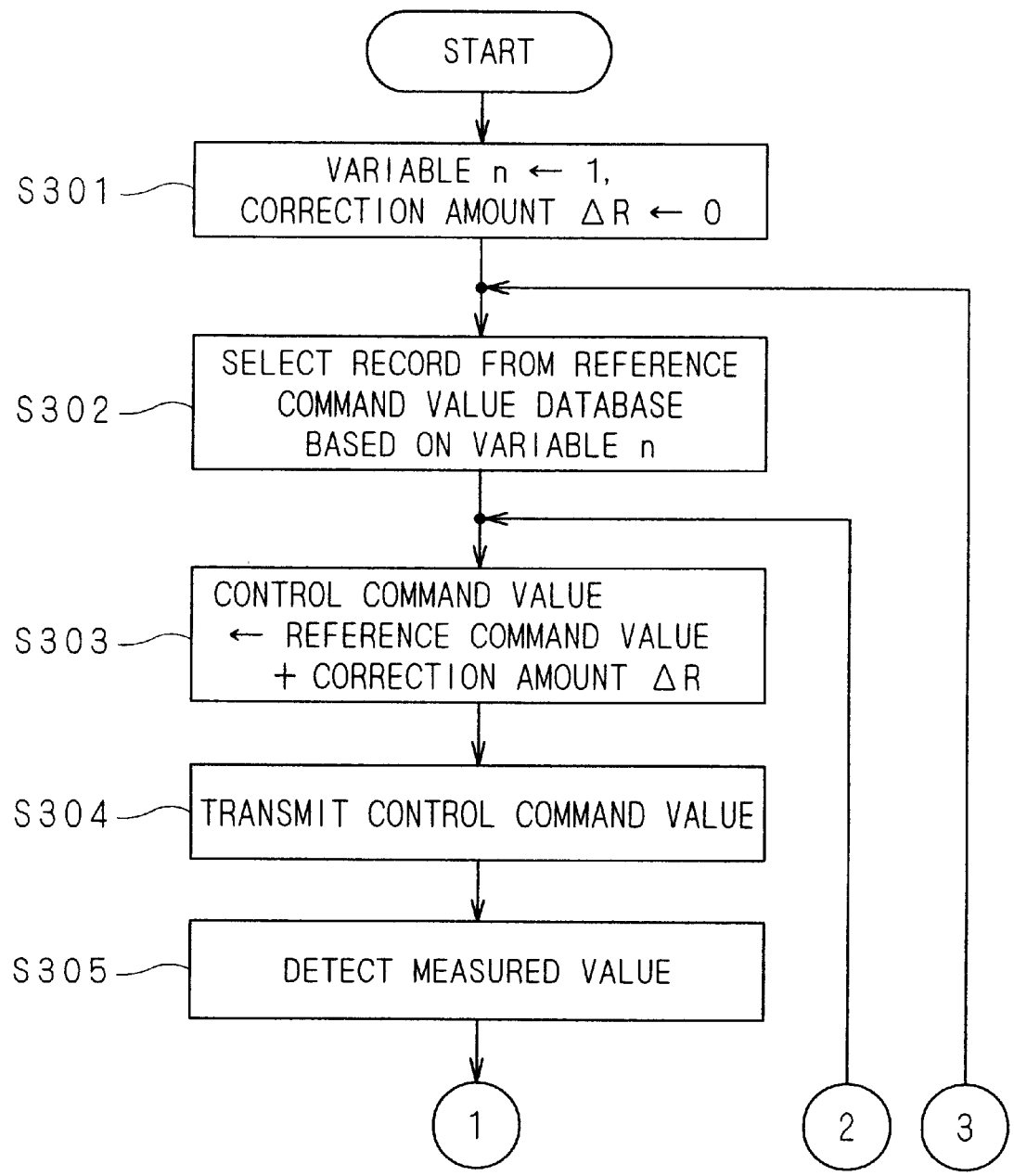
FIGS. 17 and 18 are flowcharts showing an example of the correction amount computation procedure according to the second preferred embodiment.
Figure 18:
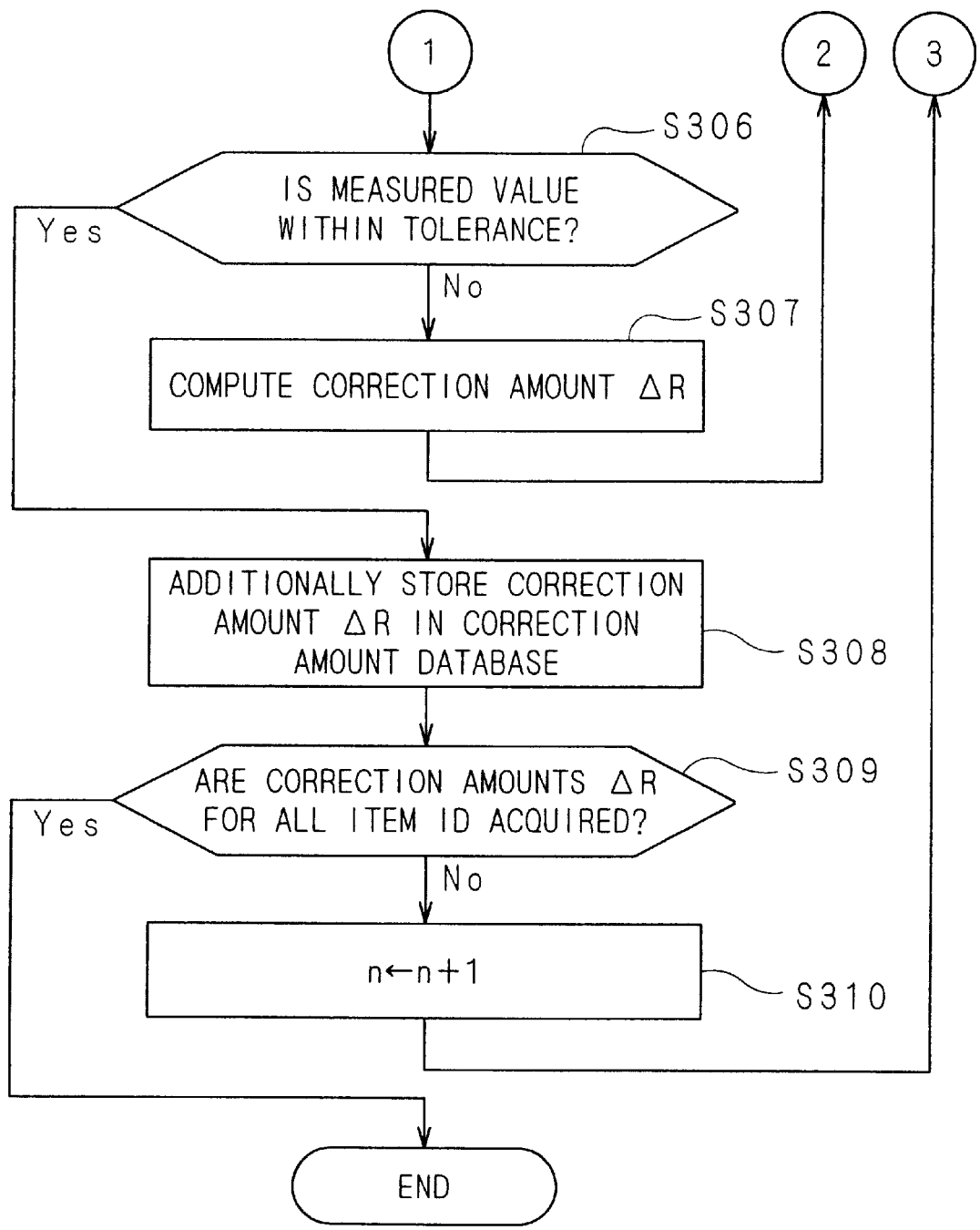

A procedure for computing the correction amounts for making the substrate processing environment of the substrate processing apparatus 200 substantially the same as that of the substrate processing apparatus 100 to suppress the variations in processing result between substrates W processed in the respective substrate processing apparatuses will be described. FIGS. 17 and 18 are flowcharts showing the procedure for computing the correction amounts for making the substrate processing environments substantially the same.

In the procedure for correction amount computation, when the operator gives an instruction to start a correction amount computation process using the keyboard 352 or the mouse 353 in accordance with the description on the display 351, the control unit 360 first reserves an area for the variable n and the correction amount $\Delta R$ in the memory 361, and initializes the variable n and the correction amount $\Delta R$ to n=1 and $\Delta R$=0 (in Step S301). The variable n corresponds to "Item ID" in the reference command value database 310, and is used to select a record specified by "Item ID" equal to the value of the variable n from the reference command value database 310. The correction amount $\Delta R$ is a variable for temporarily holding a computed value during the correction amount computation in Steps S303 to S307 to be described later. Next, the control unit 360 selects the record having "Item ID" equal to the value of the variable n from the reference command value database 310 to store the value of "Reference Command Value" included in the selected record in the memory 361 (in Step S302).

Next, the control unit 360 adds the correction amount $\Delta R$ to the reference command value stored in the memory 361 to produce the control command value (in Step S303). Then, the control unit 360 transmits the control command value and "Item ID" stored in the memory 361 through networks 600d and 600f to the substrate processing apparatus 200 to cause an environment control device specified by "Item ID" to operate using a parameter specified by the control command value (in Step S304).

Next, during the operation of the environment control device specified by "Item ID", a measured value indicating the actual operating state of the environment control device is detected by a sensor (e.g., a sensor 251a of the pump 251, the sensor 252a of the pump 252, the sensor 173 of each filter fan unit FFU, and the sensor 183 of the exhaust unit VC) provided in the environment control device, and is transmitted to the apparatus server 300 (in Step S305). Then, the control unit 360 determines whether or not the measured value detected by the sensor is within predetermined tolerance with respect to "Reference Command Value" stored in the memory 361 (in Step S306). If the measured value is out of the predetermined tolerance, the control unit 360 judges that the measured value and the reference command value are not substantially the same, and computes the correction amount $\Delta R$ (in Step S307). Then, the processing returns to Step S303. A variety of methods of computing the correction amount $\Delta R$ can be considered. An example of the methods is to hold a value (S−P+$\Delta R$) as a new correction amount $\Delta R$ where S is "Reference Command Value" stored in the memory 361, and P is the measured value.

On the other hand, if the measured value detected in Step S306 is within the predetermined tolerance, a new record is added to the correction amount database 320. The new record contains the following: the variable n stored in the memory 361 as "Item ID"; the correction amount $\Delta R$ stored in the memory 361 as "Correction Amount"; and "200" as "Apparatus No." indicating that the correction amount for the substrate processing apparatus 200 is held in "Correction Amount" in the new record (in Step S308). In this preferred embodiment, only "Apparatus No."="200" is fixed since the correction amount $\Delta R$ is computed only for the substrate processing apparatus 200. Since a unique value is automatically applied to "Correction Amount ID" when the new record is added, the computation process in this preferred embodiment neither generates nor stores a new value for "Correction Amount ID."

If the correction amount computation for all of the substrate processing environments included in the reference command value database 310 has not yet been completed (in Step S309), the variable n is incremented by one (in Step S310). Then, the processing returns to Step S302 for execution of the process of computing the correction amount for the substrate processing specified by a different value of "Item ID." If the computation for all of the substrate processing environments has been completed, the process of correction amount computation is terminated.

<2.4. Correction of Substrate Processing Environments>

When the substrate processing apparatus 200 in a stopped state, for example, is powered to start operating, the control unit 360 brings the spin processing units SR1 to SR4, the transport robot TR and the like into an initial state, and controls the environment control devices to set substantially the same substrate processing environments of the substrate processing apparatuses 100 and 200. A procedure for making the substrate processing environment of the substrate processing apparatus 200 substantially the same as that of the substrate processing apparatus 100 by the use of a correction amount stored in the correction amount database 320 will be described. FIG. 19 shows an example of setting of a substrate processing environment by the use of a correction amount stored in the correction amount database 320.

In the substrate processing environment setting procedure, when the substrate processing apparatus 200 is powered to start operating, an area is reserved for the variable n and the correction amount $\Delta R1$ in the memory 261, and the variable n and the correction amount $\Delta R1$ are initialized to n=1 and $\Delta R1=0$ (in Step S401). As in the correction amount computation, the variable n corresponds to "Item ID" in the reference command value database 310, and is used to select a record having "Item ID" equal to the value of the variable n from the reference command value database 310. The correction amount $\Delta R1$ is stored in the correction amount database 320, and is a variable for temporarily holding the value of "Correction Amount" to be acquired in Step S403 to be described later. Next, the record having "Item ID" equal to the value of the variable n is selected from the reference command value database 310, and the value of "Reference Command Value" included in the selected record is stored in the memory 261 (in Step S402).

Next, the control unit 260 makes connection to the apparatus server 300 through the networks 600d and 600f. Then, the control unit 260 searches the records stored in the correction amount database 320 (See FIG. 16) to select from the correction amount database 320 a record including "Item ID" equal to the value of the variable n stored in the memory 261 and "Apparatus No." equal to "200" indicating the substrate processing apparatus 200. Then, the control unit 260 acquires the value of "Correction Amount" from the selected record to hold the acquired value as the correction amount $\Delta R1$ (in Step S403). Thus searching the correction amount database 320 based on the variable n and "Apparatus No." (="200") allows the extraction of "Correction Amount" corresponding to "Reference Command Value" stored in the memory 261 from the correction amount database 320.

Next, the control unit 260 adds the correction amount $\Delta R1$ acquired in Step S403 to "Reference Command Value" stored in the memory 261 in Step S402 to produce the control command value (in Step S404). Then the control unit 260 transmits the control command value to an environment control device specified by "Item ID" equal to the variable n to cause the environment control device to operate using a predetermined value specified by the control command value (in Step S405).

The operation setting of the environment control devices is carried out and the substrate processing environment setting process proceeds progressively by repeating Steps S402 to S405 described above. If not all of the substrate processing environments included in the reference command value database 310 have yet been set (in Step S406), the variable n is incremented by one (in Step S407). Then, the processing returns to Step S402 for execution of the process of setting a substrate processing environment specified by a different value of "Item ID." If all of the substrate processing environments have been set, the correction process is terminated.

<2.5. Advantages of Substrate Processing Apparatuses of Second Preferred Embodiment>

As described hereinabove, the technique according to the second preferred embodiment includes: (1) transmitting "Reference Command Value" included in the record specified by "Item ID" in the reference command value database 310 to the environment control device corresponding to the above-mentioned "Item ID" of the substrate processing apparatus 200 for controlling the substrate processing environment; (2) operating the above-mentioned environment control device to obtain the measured value indicating the operating state of the environment control device; and (3) computing the correction amount for making the operating state of the above-mentioned environment control device substantially the same as that of an environment control device specified by "Item ID" of the substrate processing apparatus 100, based on "Reference Command Value" and the measured value. Executing such a correction amount computation for all values of "Item ID" allows the substrate processing environment of the substrate processing apparatus 200 to be substantially the same as that of the substrate processing apparatus 100. The second preferred embodiment reduces the operations for obtaining the correction amounts which have conventionally been obtained by an operator through experiments or the like, thereby reducing the time for startup of a new substrate processing apparatus similar in hardware construction to the substrate processing apparatus 100 when the new substrate processing apparatus is purchased.

Additionally, the second preferred embodiment treats the reference command value database 310 and the correction amount database 320 as different independent databases to separately manage "Reference Command Value" and "Correction Amount." This improves the efficiency of management of the control command value for controlling the substrate processing environment.

The substrate processing environment of the substrate processing apparatus 100 is controlled by using "Reference Command Value" stored in the reference command value database 310 as the control command value. The substrate processing environment of the substrate processing apparatus 200, on the other hand, is controlled by using as the control command value a value obtained by correcting "Reference Command Value" stored in the reference command value database 310 by the use of "Correction Amount" stored in the correction amount database 320 and corresponding to "Reference Command Value." Thus, the control command values for controlling the substrate processing environments of the respective substrate processing apparatuses 100 and 200 share the above-mentioned "Reference Command Value." Therefore, the use of only one "Reference Command Value" allows the control of the corresponding environment control devices in the respective substrate processing apparatuses 100 and 200.

<3. Modifications>

The present invention which has been described hereinabove is not limited to the above-mentioned preferred embodiments, but various modifications thereof may be made.

Although the substrate processing performed by the substrate processing apparatus 1 is the polymer removal process in the first preferred embodiment, the substrate processing is not limited thereto, but may be, for example, a resist process for applying a resist to a substrate W while spinning the substrate W.

"Apparatus No." in the processing procedure database 10 shown in FIGS. 5 and 6 is fixed ("Apparatus No."="90"), and the processing procedure database 10 stores the processing procedure data for use in the single substrate processing apparatus 1. However, the present invention is not limited to this. Processing procedure data for use in a plurality of substrate processing apparatuses may be stored in the single processing procedure database 10 by containing a plurality of values indicating the respective substrate processing apparatuses in "Apparatus No."

Although the procedure processing database 10 is stored in the substrate processing apparatus 1, the present invention is not limited to this. The processing procedure database 10 may be stored in the apparatus server 90, the maintenance server 93 shown in FIG. 1 or other servers not shown insofar as the servers are connected to the substrate processing apparatus 1 through the network 96.

The first preferred embodiment is adapted to store the combination of the reference command value and the correction amount, rather than the control command value itself, for each spin processing unit SR. Therefore, if the reference command value is changed, a new control command value is easily determined using the stored correction amount.

In the first preferred embodiment, the correction amounts "ΔSR1" to "ΔSR4" are determined so that the measured value in the substrate processing which is specified by "Item ID" in each spin processing unit SR is within tolerance with respect to the reference command value. However, the present invention is not limited to this. For example, a modification may be made in a manner to be described below. First, a measured value in the spin processing unit SR1 is determined in all of the substrate processing included in the processing procedure data, and is defined as a specific measured value. Then, the correction amounts "ΔSR2" to "ΔSR4" are determined so that the measured values in the substrate processing in the remaining spin processing units SR2 to SR4 are within tolerance with respect to the specific measured value.

In the second preferred embodiment, "Apparatus No." in the correction amount database 320 shown in FIG. 16 is fixed ("Apparatus No."="200"), and the correction amount database 320 stores "Correction Amount" for the substrate processing environment of the single substrate processing apparatus 200. However, the present invention is not limited to this. When a third substrate processing apparatus similar in hardware construction to the substrate processing apparatuses 100 and 200 is connected through the network 600 to the apparatus server 300, the apparatus server 300 can compute a correction amount for the third substrate processing apparatus to store the correction amount in the correction amount database 320.

In the second preferred embodiment, "Apparatus No." in the reference command value database 310 shown in FIG. 15 is fixed ("Apparatus No."="100"), and the reference command value database 310 stores "Reference Command Value" for the substrate processing environment of the single substrate processing apparatus 100. However, the present invention is not limited to this. When a third substrate processing apparatus similar in hardware construction to the substrate processing apparatuses 100 and 200 is connected through the network 600 to the apparatus server 300, "Reference Command Value" for the third substrate processing apparatus may be stored in the reference command value database 310, and "Apparatus No." indicating the third substrate processing apparatus may be contained in "Apparatus No."

Further, in the second preferred embodiment, all of the records in the reference command value database 310 have the same value of "Apparatus No." and, therefore, the reference command value database 310 stores "Reference Command Value" for only the same substrate processing apparatus. However, the present invention is not limited to this. The reference command value database 310 may store "Reference Command Value" for substrate processing apparatuses specified by different values of "Apparatus No." in correspond relation to different values of "Item ID."

While the invention has been described in detail, the foregoing description is in all aspects illustrative and not restrictive. It is understood that numerous other modifications and variations can be devised without departing from the scope of the invention.

What is claimed is:

1. A substrate processing system comprising:

a) a substrate processing apparatus having a plurality of processing units capable of processing substrates in parallel; and b) an information processor connected through a network to said substrate processing apparatus, said information processor including:

b-1) a first sending part for transmitting a first reference value as a control command value for a substrate processing function to said plurality of processing units;

b-2) a receiving part for receiving a plurality of measured values from said substrate processing apparatus, said plurality of measured values indicating respective substrate processing states in said plurality of processing units detected when said plurality of processing units are controlled in accordance with said first reference value transmitted as said control command b-3) a computing part for computing a plurality of correction amounts from said first reference value and said plurality of measured values, said plurality of correction amounts making the substrate processing states in said plurality of processing units substantially the same; and b-4) a first database for storing said plurality of correction amounts in association with said first reference value.

said substrate processing apparatus including:

a-1) a control part for controlling substrate processing in said plurality of processing units, based on said control command value transmitted from said information processor;

a-2) a measuring part for obtaining said plurality of measured values;

a-3) a second sending part for transmitting said plurality of measured values to said information processor;

a-4) a second database for storing processing procedure data, and a-5) a selective sending part for selecting processing procedure data from said second database in response to a request from said information processor to transmit the selected processing procedure data to said information processor;

said information processor further includes b-5) an extraction part for searching said first database for said first reference value equal to a second reference value included in said selected processing procedure data transmitted from said selective sending part to extract said plurality of correction amounts corresponding to said first reference value searched for; wherein said computing part carries out a new computation of said plurality of correction amounts unless the same reference value as said first reference value is stored in said first database, and said first sending part transmits said second reference value corrected using said plurality of correction amounts as said control command value to said plurality of processing units, respectively.

2. The substrate processing system according to claim 1, wherein each of said plurality of processing units includes a thermocontroller, and said computing part determines said plurality of correction amounts from said plurality of measured values and said first reference value of said thermocontroller.

3. The substrate processing system according to claim 2 wherein each of said plurality of processing units includes a flow control valve, and said computing part determines said plurality of correction amounts from said plurality of measured values and said first reference value of said flow control valve.

4. The substrate processing system according to claim 3, wherein each of said plurality of processing units includes a control valve, and said computing part determines said plurality of correction amounts from said plurality of measured values and said first reference value of said control valve.

5. A method of processing substrates placed respectively in a plurality of processing units in parallel, said plurality of processing units each executing substantially the same substrate processing, said method comprising the steps of:

a) transmitting a reference command value to said plurality of processing units to perform substrate processing;

b) obtaining a plurality of measured values indicating respective processing states in said plurality of processing units detected in said step a); and c) computing a plurality of correction amounts from said reference command value and said measured values, said plurality of correction amounts making the processing states in said plurality of processing units substantially the same.

6. The method according to claim 5, further comprising the step of d) transmitting said reference command value corrected using said plurality of correction amounts to respective ones of said plurality of processing units to perform substrate processing, said step d) being performed after said step c).

7. A substrate processing system comprising:

a) a first substrate processing apparatus;

b) a second substrate processing apparatus connected through a network to said first substrate processing apparatus; and c) an information processor connected through said network to said first and second substrate processing apparatuses;

said information processor including:

c-1) a first database for storing a reference value as a control command value for controlling a substrate processing environment of said first processing apparatus;

c-2) a first sending part for transmitting said reference value stored in said first database as said control command value for controlling a substrate processing environment of said second substrate processing apparatus;

c-3) a receiving part for receiving a measured value from said second substrate processing apparatus, said measured value indicating the substrate processing environment of said second substrate processing apparatus detected when said second substrate processing apparatus is controlled in accordance with said reference value transmitted from said first sending part;

c-4) a computing part for computing a correction amount from said reference value transmitted from said first sending part and said measured value, said correction amount making the substrate processing environments of said first and second processing apparatuses substantially the same;

c-5) a second database for storing said correction amount in association with said reference value transmitted from said first sending part, and c-6) an extraction part for extracting a corresponding correction amount from said second database, said corresponding correction amount being said correction amount corresponding to a select reference value selected as said reference value from said first database, said second substrate processing apparatus including:

b-1) a control part for controlling an element in said second substrate processing apparatus, based on said control command value transmitted from said information processor;

b-2) a measuring part for obtaining said measured value; and b-3) a second sending part for transmitting said measured value to said information processor, wherein said first sending part transmits said select reference value corrected using said corresponding correction amount as said control command value to said second substrate processing apparatus.

8. The substrate processing system according to claim 7, wherein said element controlled in said second substrate processing apparatus includes an environment adjustment unit for adjusting the substrate processing environment of said second substrate processing apparatus, and said control part controls said environment adjustment unit, based on said control command value transmitted from said information processor.

9. The substrate processing system according to claim 8, wherein each of said first and second substrate processing apparatuses includes a downflow formation part for forming a downflow of clean air, and said computing part determines said correction amount from said measured value and said reference value for said downflow formation part of said first substrate processing apparatus.

10. The substrate processing system according to claim 9, wherein each of said first and second substrate processing apparatuses includes an exhaust unit for exhausting an atmosphere therefrom, and said computing part determines said correction amount from said measured value and said reference value for said exhaust unit of said first substrate processing apparatus.

11. The substrate processing system according to claim 8, wherein;

said first substrate processing apparatus includes a first pipe for introducing a fluid supplied from a fluid source into said first substrate processing apparatus, and a pressure measuring part for measuring the pressure value of said fluid in said first pipe as a substrate processing environment in said first pipe;

said second substrate processing apparatus further includes a second pipe connected in communication with said environment adjustment unit for introducing a fluid supplied from said fluid source into said second substrate processing apparatus;

said first sending part transmits the pressure value of said fluid as said control command value;

said measuring part measures the pressure value of said fluid in said second pipe; and said computing part determines said correction amount from said pressure value of said fluid and said measured value.

12. The substrate processing system according to claim 11, wherein said fluid is a substrate processing solution.

13. The substrate processing system according to claim 11, wherein said fluid is a gas for use during substrate processing.

14. The substrate processing system according to claim 13, wherein said environment adjustment unit is a pump for controlling the pressure of said fluid.

15. A method of processing a substrate, comprising the steps of:

a) transmitting a reference value transmitted as a control command value to both, a first substrate processing apparatus having a first environment controller for controlling a substrate processing environment and also to a second substrate processing apparatus having a second environmental controller capable of executing substantially the same processing as said first environmental controller, to set a substrate processing environment of said second substrate processing apparatus;

b) acquiring a measured value indicating the substrate processing environment of said second substrate processing apparatus detected when said second substrate processing apparatus is controlled using said reference value; and c) computing a correction amount for said reference value from said reference value and said measured value, said correction amount making the substrate processing environments of said first and second substrate processing apparatuses substantially the same.

16. The method according to claim 15, further comprising the step of d) transmitting said reference value corrected using said correction amount to said second substrate processing apparatus to set the substrate processing environment of said second substrate processing apparatus.

17. A substrate processing system comprising:

a) a substrate processing apparatus having a plurality of processing units capable of processing substrates in parallel, said plurality of processing units each executing substantially the same substrate processing; and b) an information processor connected through a network to said substrate processing apparatus, said information processor including:

b-1) a first sending part for transmitting a first reference value as a control command value for a substrate processing function to said plurality of processing units;

b-2) a receiving part for receiving a plurality of measured values from said substrate processing apparatus, said plurality of measured values indicating respective substrate processing states in said plurality of processing units detected when said plurality of processing units are controlled in accordance with said first reference value transmitted as said control command value;

b-3) a computing part for computing a plurality of correction amounts from said first reference value and said plurality of measured values, said plurality of correction amounts making the substrate processing states in said plurality of processing units substantially the same; and b-4) a first database for storing said plurality of correction amounts in association with said first reference value, said substrate processing apparatus including:

a-1) a control part for controlling substrate processing in said plurality of processing units, based on said control command value transmitted from said information processor;

a-2) a measuring part for obtaining said plurality of measured values; and a-3) a second sending part for transmitting said plurality of measured values to said information processor.

18. The substrate processing system according to claim 17, wherein said computing part carries out new computation of said plurality of correction amounts unless the same reference value as said first reference value is stored in said first database.

19. A substrate processing system comprising:

a) a substrate processing apparatus having a plurality of processing units capable of processing substrates in parallel, said plurality of processing units each executing substantially the same substrate processing; and b) an information processor connected through a network to said substrate processing apparatus, said information processor including:

b-1) a first sending part for transmitting a first reference value as a control command value for a substrate processing function to said plurality of processing units;

b-2) a receiving part for receiving a plurality of measured values from said substrate processing apparatus, said plurality of measured values indicating respective substrate processing states in said plurality of processing units detected when said plurality of processing units are controlled in accordance with said first reference value transmitted as said control command value;

b-3) a computing part for computing a plurality of correction amounts from a specific measured value indicating a processing state in one of said plurality of processing units and the remainder of said measured values other than said specific measured value, said plurality of correction amounts making the substrate processing state in other than said one processing unit substantially the same as that in said one processing unit; and b-4) a first database for storing said plurality of correction amounts in association with said first reference value, said substrate processing apparatus including:

a-1) a control part for controlling substrate processing in said plurality of processing units, based on said control command value transmitted from said information processor;

a-2) a measuring part for obtaining said plurality of measured values; and a-3) a second sending part for transmitting said plurality of measured values to said information processor.

20. A substrate processing system comprising:

a) a first substrate processing apparatus having a first environment controller for controlling a substrate processing environment;

b) a second substrate processing apparatus connected through a network to said first substrate processing apparatus, said second substrate processing apparatus having a second environment controller capable of executing substantially the same processing as said first environment controller; and c) an information processor connected through said network to said first and second substrate processing apparatuses, said information processor including:

c-1) a first database for storing a reference value as a control command value for controlling a substrate processing environment of said first substrate processing apparatus;

c-2) a first sending part for transmitting said reference value stored in said first database as said control command value for controlling a substrate processing environment of said second substrate processing apparatus;

c-3) a receiving part for receiving a measured value from said second substrate processing apparatus, said measured value indicating the substrate processing environment of said second substrate processing apparatus detected when said second substrate processing apparatus is controlled in accordance with said reference value transmitted from said first sending part;

c-4) a computing part for computing a correction amount from said reference value transmitted from said first sending part and said measured value, said correction amount making the substrate processing environments of said first and second processing apparatuses substantially the same; and c-5) a second database for storing said correction amount in association with said reference value transmitted from said first sending part, said second substrate processing apparatus including:

b-1) a control part for controlling an element in said second substrate processing apparatus, based on said control command value transmitted from said information processor;

b-2) a measuring part for obtaining said measured value; and b-3) a second sending part for transmitting said measured value to said information processor.

* * * * *